(12) United States Patent
Shinada et al.

(10) Patent No.: US 11,189,914 B2
(45) Date of Patent: *Nov. 30, 2021

(54) LIQUID CRYSTAL CELL AND SCANNING ANTENNA

(71) Applicant: Sharp Kabushiki Kaisha, Sakai (JP)

(72) Inventors: Kei Shinada, Sakai (JP); Isamu Miyake, Sakai (JP); Takashi Katayama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 233 days.

This patent is subject to a terminal disclaimer.

(21) Appl. No.: 16/336,215

(22) PCT Filed: Sep. 22, 2017

(86) PCT No.: PCT/JP2017/034265
§ 371 (c)(1),
(2) Date: Mar. 25, 2019

(87) PCT Pub. No.: WO2018/056393
PCT Pub. Date: Mar. 29, 2018

(65) Prior Publication Data
US 2019/0221927 A1    Jul. 18, 2019

(30) Foreign Application Priority Data

Sep. 26, 2016   (JP) .............................. JP2016-186874

(51) Int. Cl.
*H01Q 1/38*     (2006.01)
*H01Q 19/10*    (2006.01)
(Continued)

(52) U.S. Cl.
CPC ............... *H01Q 1/38* (2013.01); *C09K 19/10* (2013.01); *C09K 19/18* (2013.01); *C09K 19/56* (2013.01);
(Continued)

(58) Field of Classification Search
CPC ............ H01Q 1/38; H01Q 3/44; H01Q 21/06; H01Q 21/064; H01Q 19/10; H01Q 13/22;
(Continued)

(56) References Cited

U.S. PATENT DOCUMENTS 7,466,269 B2   12/2008   Haziza
7,884,766 B2    2/2011   Haziza
(Continued)

FOREIGN PATENT DOCUMENTS

| JP | 2009-538565 A | 11/2009 |
|----|---------------|---------|
| JP | 2013-539949 A | 10/2013 |
| JP | 2016-512408 A |  4/2016 |

*Primary Examiner* — Dimary S Lopez Cruz
*Assistant Examiner* — Michael M Bouizza
(74) *Attorney, Agent, or Firm* — Keating & Bennett, LLP

(57) ABSTRACT

A liquid crystal cell according to the present invention includes: a TFT substrate including a first dielectric substrate, TFTs supported on the first dielectric substrate, and patch electrodes electrically connected to the TFTs; a slot substrate including a second dielectric substrate and a slot electrode including slots supported on the second dielectric substrate; a liquid crystal layer interposed between the TFT substrate and the slot substrate which are arranged in a form in which the patch electrode and the slot electrode face each other; antenna units each including one of the patch electrodes and the slot electrode including at least one of the slots arranged corresponding to the one of the patch electrodes; and alignment films formed on surfaces of both of the TFT substrate and the slot substrate facing the liquid crystal (Continued)

layer, made of a polyimide-based resin, and having a relative dielectric constant of 3.8 or more.

27 Claims, 7 Drawing Sheets

(51) Int. Cl.
| | |
|---|---|
| *H01Q 21/06* | (2006.01) |
| *C09K 19/10* | (2006.01) |
| *C09K 19/56* | (2006.01) |
| *H01L 27/12* | (2006.01) |
| *H01Q 13/22* | (2006.01) |
| *G02F 1/1337* | (2006.01) |
| *H01Q 3/34* | (2006.01) |
| *G02F 1/13* | (2006.01) |
| *C09K 19/18* | (2006.01) |
| *H01Q 3/44* | (2006.01) |
| *C09K 19/04* | (2006.01) |
| *H01L 29/786* | (2006.01) |

(52) U.S. Cl.
CPC .............. *G02F 1/13* (2013.01); *G02F 1/1337* (2013.01); *H01L 27/1214* (2013.01); *H01L 27/1248* (2013.01); *H01L 27/1255* (2013.01); *H01Q 3/34* (2013.01); *H01Q 3/44* (2013.01); *H01Q 13/22* (2013.01); *H01Q 19/10* (2013.01); *H01Q 21/06* (2013.01); *H01Q 21/064* (2013.01); *C09K 2019/0448* (2013.01); *H01L 27/124* (2013.01); *H01L 27/1222* (2013.01); *H01L 29/78669* (2013.01)

(58) Field of Classification Search
CPC .......... H01Q 3/34; C09K 19/56; C09K 19/10; C09K 2019/0448; C09K 19/18; H01L 27/1222; H01L 29/78669; H01L 27/124; H01L 27/1214; H01L 27/1255; H01L 27/1248; G02F 1/1323; G02F 2203/24; G02F 1/1337; G02F 1/13
See application file for complete search history.

(56) References Cited

U.S. PATENT DOCUMENTS

| | | | |
|---|---|---|---|
| 9,385,435 | B2 | 7/2016 | Bily et al. |
| 9,450,310 | B2 | 9/2016 | Bily et al. |
| 10,062,968 | B2 | 8/2018 | Bily et al. |
| 10,090,599 | B2 | 10/2018 | Bily et al. |
| 10,770,792 | B2 * | 9/2020 | Mizusaki ............... H01Q 21/06 |
| 2008/0036664 | A1 | 2/2008 | Haziza |
| 2009/0091500 | A1 | 4/2009 | Haziza |
| 2012/0194399 | A1 | 8/2012 | Bily et al. |
| 2014/0266946 | A1 | 9/2014 | Bily et al. |
| 2014/0299881 | A1 * | 10/2014 | Oda ...................... H01L 27/124 257/59 |
| 2015/0229028 | A1 | 8/2015 | Bily et al. |
| 2016/0261042 | A1 * | 9/2016 | Sazegar ............... H01Q 21/061 |
| 2016/0359234 | A1 | 12/2016 | Bily et al. |
| 2016/0372834 | A1 | 12/2016 | Bily et al. |

* cited by examiner

LIQUID CRYSTAL CELL AND SCANNING ANTENNA

TECHNICAL FIELD

The present invention relates to a liquid crystal cell and a scanning antenna.

BACKGROUND ART

Antennas used for mobile communication, satellite broadcasting, and the like require a beam scanning function that can change a beam direction. As the antenna having such a function, a scanning antenna utilizing a high dielectric anisotropy (birefringence) of a liquid crystal material (including a nematic liquid crystal and a polymer-dispersed liquid crystal) has been suggested (for example, Patent Documents 1 to 3).

This type of scanning antenna includes a liquid crystal cell for a scanning antenna having a configuration in which a liquid crystal layer is interposed between a pair of substrates with electrodes. By applying a voltage between the electrode of one substrate of the liquid crystal cell and the electrode of the other substrate of the liquid crystal cell to change a capacitance of the liquid crystal layer, it is possible to control a transmission/reception direction of radio waves. An alignment film for aligning a liquid crystal compound in the liquid crystal layer in a predetermined direction is formed on a surface of the substrate facing the liquid crystal layer.

RELATED ART DOCUMENT

Patent Document

Patent Document 1: Japanese Translation of PCT International Application Publication No. JP-T-2013-539949
Patent Document 2: Japanese Translation of PCT International Application Publication No. JP-T-2016-512408
Patent Document 3: Japanese Translation of PCT International Application Publication No. JP-T-2009-538565

Problem to be Solved by the Invention

In the liquid crystal cell, it is preferable to increase a variation in capacitance due to application of a voltage in order to increase a gain of the antenna. However, a composite capacitance when the alignment film is provided for the alignment of the liquid crystal layer becomes smaller than a capacitance of a single body of the liquid crystal layer. In particular, if an alignment film (relative dielectric constant: about from 2.6 to 3.2) made of an acrylic resin having a low relative dielectric constant is used for the liquid crystal cell, the composite capacitance is remarkably decreased.

In addition, if a rising angle (pretilt angle) of liquid crystal molecules is large (for example, the pretilt angle is 5°) when no voltage is applied, the capacitance when no voltage is applied is increased depending on the pretilt angle and the variation in the capacitance is decreased correspondingly.

DISCLOSURE OF THE PRESENT INVENTION

An object of the present invention is to provide a liquid crystal cell having a large variation in capacitance and a scanning antenna including the liquid crystal cell.

Means for Solving the Problem

A liquid crystal cell according to the present invention includes: a thin film transistor (TFT) substrate including a first dielectric substrate, TFTs supported on the first dielectric substrate, and patch electrodes electrically connected to the TFTs; a slot substrate including a second dielectric substrate and a slot electrode including slots supported on the second dielectric substrate; a liquid crystal layer interposed between the TFT substrate and the slot substrate that are arranged such that the patch electrode and the slot electrode face each other; antenna units each including one of the patch electrodes and the slot electrode including at least one of the slots arranged corresponding to the one of the patch electrodes; and alignment films formed on surfaces of both of the TFT substrate and the slot substrate facing the liquid crystal layer, the alignment films being made of a polyimide-based resin, and having a relative dielectric constant of 3.8 or more.

A liquid crystal cell according to the present invention includes: a TFT substrate including a first dielectric substrate, TFTs supported on the first dielectric substrate, and patch electrodes electrically connected to the TFTs; a slot substrate having a second dielectric substrate and a slot electrode including slots supported on the second dielectric substrate; a liquid crystal layer interposed between the TFT substrate and the slot substrate that are arranged such that the patch electrode face each other; antenna units each including one of the patch electrodes and the slot electrodes including at least one of the slots arranged corresponding to the one of the patch electrodes; and an alignment film formed on a surface of any one of the TFT substrate and the slot substrate facing the liquid crystal layer, the alignment film being made of a polyimide-based resin, and having a relative dielectric constant of 3.8 or more.

Preferably, in the liquid crystal cell, the alignment film may have the relative dielectric constant of 4.2 or more.

Preferably, in the liquid crystal cell, the alignment film may have a thickness of 0.18 µm or less.

Preferably, in the liquid crystal cell, the alignment film formed on the TFT substrate and the alignment film formed on the slot substrate may have a different thickness from each other, and both the alignment films may have a thickness of 0.18 µm or less.

Preferably, in the liquid crystal cell, the alignment film may have a thickness of 0.12 µm or less.

Preferably, the liquid crystal cell may have a thickness of 3.9 µm or less.

Preferably, in the liquid crystal cell, in one of the antenna units, the patch electrode and the slot electrode may overlap each other at a length of 30 µm or more.

Preferably, in the liquid crystal cell, the slot may have a width of 60 µm or more.

Preferably, in the liquid crystal cell, the alignment film may align a liquid crystal compound included in the liquid crystal layer at a pretilt angle of 1° or less.

Preferably, in the liquid crystal cell, the liquid crystal compound may have a positive dielectric anisotropy.

Preferably, in the liquid crystal cell, the liquid crystal compound may have a dielectric anisotropy $\Delta\varepsilon$ of 10 or more.

Preferably, in the liquid crystal cell, a variation $\Delta C$ in capacitance when no voltage is applied and when a voltage of 15 V is applied between the patch electrode of the TFT substrate and the slot electrode of the slot substrate may be 1000 pF or more.

In addition, a scanning antenna according to the present invention includes: the liquid crystal cell according to any one of the above descriptions; and a reflective conductive plate disposed so as to face an opposite surface of the second dielectric substrate on which the slot electrode is not formed, with a dielectric layer interposed therebetween.

Advantageous Effect of the Invention

According to the present invention, it is possible to provide the liquid crystal cell having a large variation in capacitance and the scanning antenna including the liquid crystal cell.

MODE FOR CARRYING OUT THE INVENTION

First Embodiment (Basic Structure of Scanning Antenna)

A scanning antenna has a beam scanning function that can change a direction of a beam, and has a structure in which the scanning antenna includes antenna units that use high anisotropy (birefringence) of a dielectric constant M ($\varepsilon$M) of a liquid crystal material. The scanning antenna controls a voltage applied to a liquid crystal layer of each antenna unit to change an effective dielectric constant M ($\varepsilon$M) of the liquid crystal layer of each antenna unit, thereby forming a two-dimensional pattern by the antenna units having different capacitances. Since the dielectric constant of the liquid crystal material has frequency dispersion, in the present description, a dielectric constant in a frequency band of a microwave is particularly referred to as a "dielectric constant M ($\varepsilon$M)" in the present description.

Electromagnetic waves (for example, microwaves) emitted from the scanning antenna or received by the scanning antenna are given a phase difference corresponding to a capacitance of each antenna unit to have a strong directivity in a specific direction depending on the two-dimensional pattern formed by the antenna units having the different capacitances (beam scanning). For example, the electromagnetic waves emitted from the scanning antenna can be obtained by integrating spherical waves obtained by allowing input electromagnetic waves to be incident to each antenna unit and scattering the incident input electromagnetic waves by each antenna unit in consideration of the phase difference given by each antenna unit.

Figure 1:
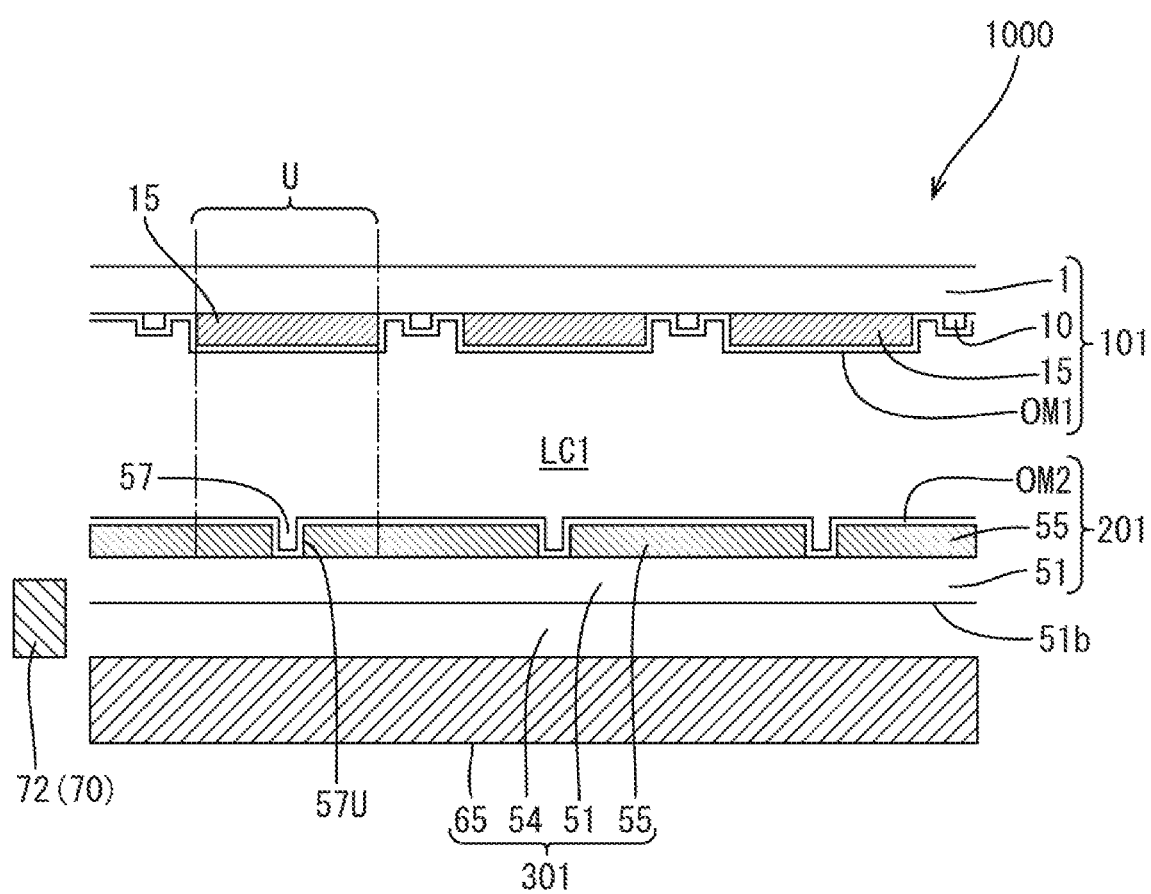
FIG. 1 is a cross-sectional view schematically showing a part of a scanning antenna according to a first embodiment.

Here, a basic structure of a scanning antenna according to an embodiment of the present invention will be described with reference to FIG. 1 and the like. FIG. 1 is a cross-sectional view schematically showing a part of a scanning antenna 1000 according to a first embodiment. The scanning antenna 1000 according to the present embodiment is a radial inline slot antenna in which slots 57 are arranged concentrically. In FIG. 1, a part of a cross section taken along a radial direction from a feeding pin 72 provided in the vicinity of the center of the slots arranged concentrically is schematically shown. In another embodiment, an array of the slots may be various known arrays (for example, a spiral shape or a matrix shape).

The scanning antenna 1000 mainly includes a thin film transistor (TFT) substrate 101, a slot substrate 201, a liquid crystal layer LC disposed between the TFT substrate 101 and the slot substrate 201, and a reflective conductive plate 65. The scanning antenna 1000 is configured to transmit and receive microwaves to and from the TFT substrate 101. The TFT substrate 101 and the slot substrate 201 are disposed so as to face each other with the liquid crystal layer LC interposed therebetween.

The TFT substrate 101 includes a dielectric substrate (an example of a first dielectric substrate) 1 such as a glass substrate, patch electrodes 15 and thin film transistors (TFTs) 10 formed on a surface of the dielectric substrate 1 facing the liquid crystal layer LC, and an alignment film OM1 formed on the outermost surface of the dielectric substrate 1 facing the liquid crystal layer LC. A gate bus line and a source bus line (not shown in FIG. 1) are connected to each TFT 10.

The slot substrate 201 includes a dielectric substrate (an example of a second dielectric substrate) 51 such as a glass substrate, a slot electrode 55 formed on a surface of the dielectric substrate 51 facing the liquid crystal layer LC, and an alignment film OM2 formed on an outermost surface of the dielectric substrate facing the liquid crystal layer LC. The slot electrode 55 has slots 57.

It is preferable that the dielectric substrates 1 and 51 each used in the TFT substrate 101 and the slot substrate 201 have a small dielectric loss against microwaves, and in addition to the glass substrate, a plastic substrate can be used as the dielectric substrates 1 and 51. A thickness of each of the dielectric substrates 1 and 51 is not particularly limited, and is, for example, preferably, 400 μm or less, more preferably, 300 μm or less. A lower limit of the thickness of each of the dielectric substrates 1 and 51 is not particularly limited, and may be any value as long as each of the dielectric substrates 1 and 51 has strength enough to withstand in a producing process and the like.

The reflective conductive plate 65 is disposed so as to face the slot substrate 201 with an air layer 54 interposed therebetween. In another embodiment, a layer formed of a dielectric (for example, a fluororesin such as polytetrafluoroethylene (PTFE)) having a small dielectric constant M for microwaves may be used instead of the air layer 54. In the scanning antenna 1000 according to the present embodiment, the slot electrode 55, the reflective conductive plate 65, and the dielectric substrate 51 and the air layer 54 between the slot electrode 55 and the reflective conductive plate 65 function as a waveguide 301.

The patch electrode 15, a portion (hereinafter, also referred to as a "slot electrode unit 57U") of the slot electrode 55 including the slot 57, and the liquid crystal layer LC between the patch electrode 15 and the slot electrode unit 57U constitute an antenna unit U. In each antenna unit U, one island-shaped patch electrode 15 faces one hole-shaped slot 57 (slot electrode unit 57U) with the liquid crystal layer LC interposed therebetween, such that a liquid crystal capacitance is configured. In the scanning antenna 1000 according to the present embodiment, antenna units U are arranged concentrically. It should be noted that the antenna unit U includes an auxiliary capacitance electrically connected in parallel with the liquid crystal capacitance.

The slot electrode 55 constitutes the antenna unit U in each slot electrode unit 57U, and also functions as a wall of the waveguide 301. For this reason, the slot electrode 55 needs to have a function of suppressing transmission of the microwaves, and is formed of a relatively thick metal layer. Examples of the metal layer can include a copper (Cu) layer, an aluminum (Al) layer, and the like. For example, in order to reduce a microwave of 10 GHz up to $1/150$, a thickness of the Cu layer is set to 3.3 µm or more, and a thickness of the Al layer is set to 4.0 µm or more. In addition, in order to reduce a microwave of 30 GHz up to $1/150$, a thickness of the Cu layer is set to 1.9 µm or more, and a thickness of the Al layer is set to 2.3 µm or more. An upper limit of a thickness of the metal layer constituting the slot electrode 55 is not particularly limited, but it can be preferable that the thickness of the metal layer is as small as possible in consideration of the formation of the alignment film OM2 as described below. When the Cu layer is used as the metal layer, there is an advantage that the Cu layer can be made thinner than the Al layer. As a method of forming the slot electrode 55, other methods such as a thin film deposition method used in technology of a liquid crystal display device according to the related art or a method of attaching a metal foil (for example, a Cu foil or an Al foil) onto a substrate may be used. A thickness of the metal layer is set to, for example, 2 µm or more to 30 µm or less. In addition, in a case of forming the metal layer by the thin film deposition method, the thickness of the metal layer is set to, for example, 5 µm or less. For example, an aluminum plate, a copper plate, or the like having a thickness of several millimeters can be used as the reflective conductive plate 65.

Since the patch electrode 15 does not constitute the waveguide 301 unlike the slot electrode 55, the patch electrode 15 is formed of a metal layer having a thickness smaller than that of the slot electrode 55. It is preferable that a resistance of the patch electrode 15 is low in order to avoid loss that vibrations of free electrons in the patch electrode 15 are changed into heat when vibrations of free electrons in the vicinity of the slot 57 of the slot electrode 55 cause the vibrations of the free electrons in the patch electrode 15. In terms of mass productivity and the like, it is more preferable to use an Al layer than to use a Cu layer, and it is preferable that a thickness of the Al layer is, for example, 0.5 µm or more to 2 µm or less.

An array pitch of the antenna units U is set to, for example, $\lambda/4$ or less and/or $\lambda/5$ or less in a case where a wavelength of the microwave is $\lambda$ as described in Patent Document 1. The wavelength $\lambda$ is, for example, 25 mm, and the array pitch in this case is set to, for example, 6.25 mm or less and/or 5 mm or less.

The scanning antenna 1000 changes phases of microwaves excited (re-radiated) from each patch electrode 15 by changing a capacitance value of the liquid crystal capacitance of the antenna unit U. Therefore, as a liquid crystal material of the liquid crystal layer LC, it is preferable to use a liquid crystal material of which anisotropy ($\Delta\varepsilon M$) of a dielectric constant M ($\varepsilon M$) for the microwave is large and tan $\delta M$ (dielectric loss tangent for the microwave) is small. For example, a liquid crystal material of which $\Delta\varepsilon M$ is 4 or more and tan $\delta M$ is 0.02 or less (both of them are values of 19 GHz) as described in SID 2015 DIGEST pp. 824 to 826 written by M. Wittek et al. can be appropriately used. In addition to this material, a liquid crystal material of which $\Delta\varepsilon M$ is 0.4 or more and tan $\delta M$ is 0.04 or less as described in Polymer 55 vol. August, pp. 599 to 602 (2006) written by Kuki can be used.

Although the dielectric constant of the liquid crystal material generally has frequency dispersion, the dielectric anisotropy $\Delta\varepsilon M$ for the microwave has a positive correlation with refractive index anisotropy $\Delta n$ for visible light. For this reason, it can be said that it is preferable that a liquid crystal material for the antenna unit for the microwave is a material having a large refractive index anisotropy $\Delta n$ for the visible light. Here, when $\Delta n$ (birefringence) for light of 550 nm is used as an index, a nematic liquid crystal of which $\Delta n$ is 0.3 or more, preferably 0.4 or more is used for the antenna unit for the microwave. An upper limit of $\Delta n$ is not particularly limited. A thickness of the liquid crystal layer LC is set to, for example, 1 µm or more to 500 µm or less.

Figure 2:
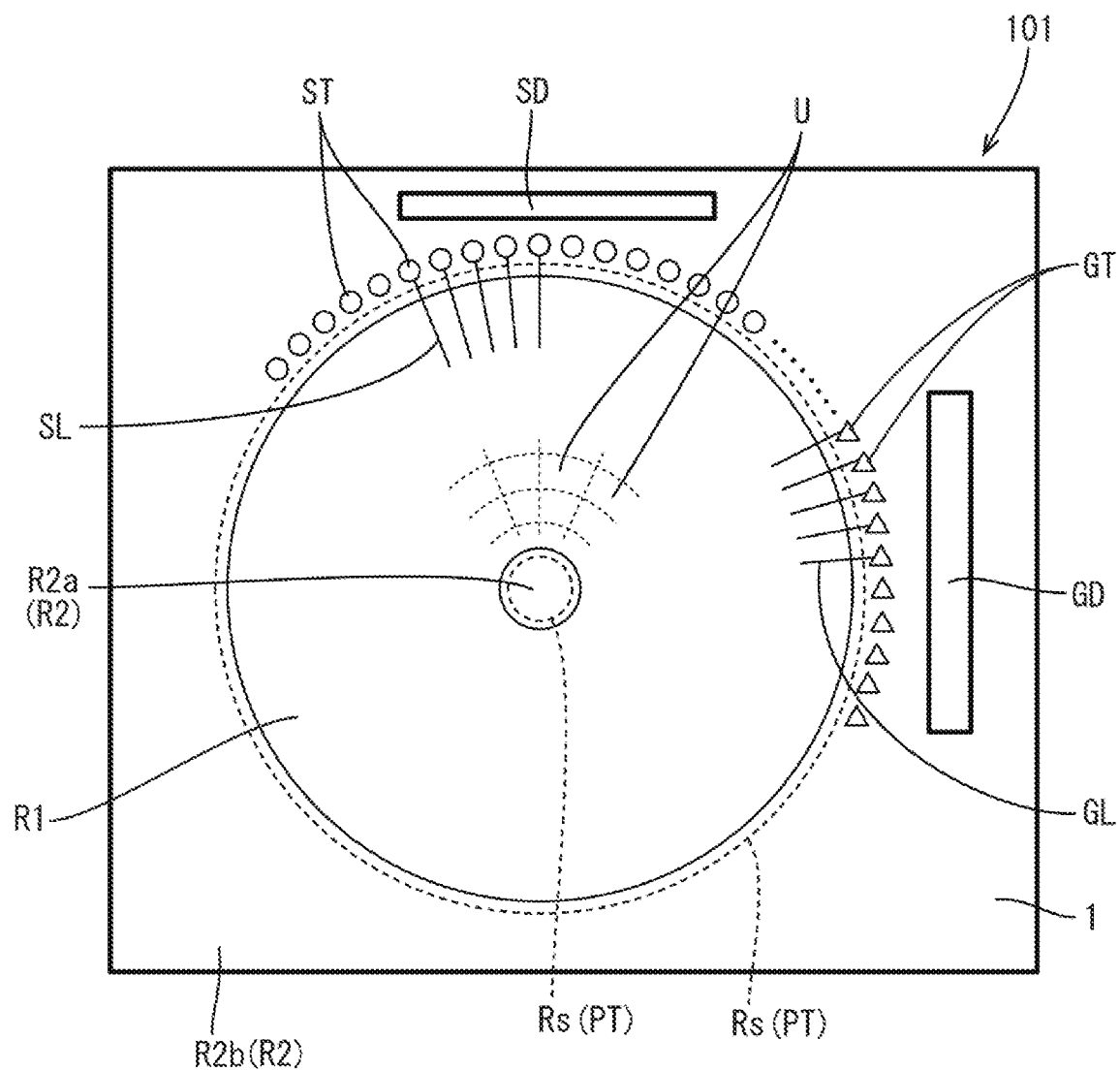
FIG. 2 is a plan view schematically showing a thin film transistor (TFT) substrate included in the scanning antenna.
Figure 3:
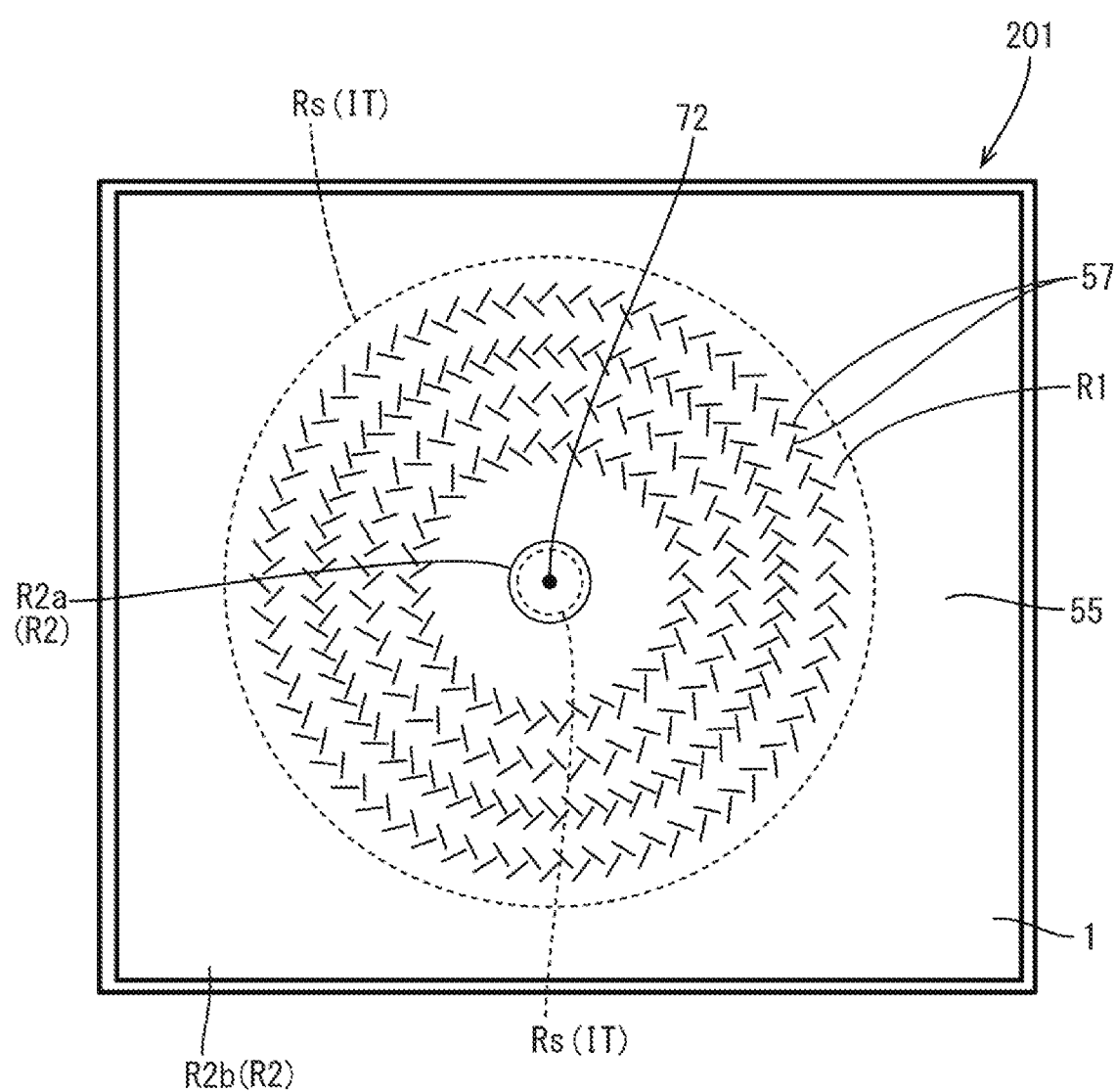
FIG. 3 is a plan view schematically showing a slot substrate included in the scanning antenna.

FIG. 2 is a plan view schematically showing the TFT substrate 101 included in the scanning antenna 1000, and FIG. 3 is a plan view schematically showing the slot substrate 201 included in the scanning antenna 1000. It should be noted that a region of the TFT substrate 101 and a region of the slot substrate 201 that correspond to the antenna unit U are together referred to as an "antenna unit region" for convenience of explanation, and the same reference symbols as that of the antenna unit are used as reference symbols of the antenna unit region. As shown in FIGS. 2 and 3, in the TFT substrate 101 and the slot substrate 201, a region defined by antenna unit regions U that are two-dimensionally arranged is referred to as a "transmission/reception region R1", and a region other than the transmission/reception region R1 is referred to as a "non-transmission/reception region R2". In the non-transmission/reception region R2, a terminal portion, a drive circuit, and the like are arranged.

The transmission/reception region R1 has a ring shape when viewed in a plane. The non-transmission/reception region R2 includes a first non-transmission/reception region R2a positioned at a central portion of the transmission/reception region R1 and a second non-transmission/reception region R2b disposed at a circumference of the transmission/reception region R1. An outer diameter of the transmission/reception region R1 is, for example, 200 mm or more to 1,500 mm or less, and is appropriately set depending on a communication amount or the like.

Gate bus lines GL and source bus lines SL supported by the dielectric substrate 1 are provided on the transmission/reception region R1 of the TFT substrate 101, and driving of each antenna unit region U is controlled by using these wirings. Each antenna unit region U includes the TFT 10 and the patch electrode 15 electrically connected to the TFT 10. A source electrode of the TFT 10 is electrically connected to a source bus line SL, and a gate electrode of the TFT 10 is electrically connected to a gate bus line GL. In addition, a drain electrode of the TFT 10 is electrically connected to the patch electrode 15.

In the non-transmission/reception region R2 (the first non-transmission/reception region R2a and the second non-transmission/reception region R2b), seal regions Rs in which a sealing material (not shown) is formed so as to surround the transmission/reception region R1 are arranged. The sealing material has a function of bonding the TFT substrate 101 and the slot substrate 201 to each other and sealing the liquid crystal material (liquid crystal layer LC)

between the TFT substrate 101 and the slot substrate 201, or the like. Details of the sealing material will be described below.

Gate terminal portions GT, a gate driver GD, source terminal portions ST, and a source driver SD are arranged outside the seal region Rs of the non-transmission/reception region R2. Each gate bus line GL is connected to the gate driver GD through the gate terminal portion GT, and each source bus line SL is connected to the source driver SD through the source terminal portion ST. It should be noted that both of the source driver SD and the gate driver GD are formed on the dielectric substrate 1 of the TFT substrate 101 in the present embodiment, but one or both of the source driver SD and the gate driver GD may also be formed on the dielectric substrate 51 of the slot substrate 201.

In addition, transfer terminal portions PT are provided in the non-transmission/reception region R2. The transfer terminal portions PT are electrically connected to the slot electrode 55 of the slot substrate 201. In the present embodiment, the transfer terminal portions PT are arranged in both of the first non-transmission/reception region R2a and the second non-transmission/reception region R2b. In another embodiment, the transfer terminal portions PT may be arranged in only any one of the first non-transmission/reception region R2a and the second non-transmission/reception region R2b. In addition, in the present embodiment, the transfer terminal portions PT are arranged in the seal regions Rs. For this reason, a conductive resin containing conductive particles (conductive beads) is used as the sealing material.

As shown in FIG. 3, in the slot substrate 201, the slot electrode 55 is formed over the transmission/reception region R1 and the non-transmission/reception region R2 on the dielectric substrate 51. In FIG. 3, a surface of the slot substrate 201 viewed from the liquid crystal layer LC is shown, and for convenience of explanation, the alignment film OM2 formed on the outermost surface of the slot substrate 201 is omitted.

In the transmission/reception region R1 of the slot substrate 201, slots 57 are arranged in the slot electrode 55. These slots 57 are assigned one by one to the antenna unit regions U of the TFT substrate 101, respectively. In the present embodiment, the slots 57 including a pair of slots 57 extending in directions substantially orthogonal to each other are arranged concentrically so as to form the radial inline slot antenna. Since the scanning antenna 1000 has such a pair of slots 57, the scanning antenna 1000 can transmit and receive circularly polarized waves.

In the non-transmission/reception region R2 of the slot substrate 201, terminal portions IT of the slot electrode 55 are provided. The terminal portions IT are electrically connected to the transfer terminal portions PT of the TFT substrate 101. In the present embodiment, the terminal portions IT are arranged in the seal regions Rs, and are electrically connected to the corresponding transfer terminal portions PT by the sealing material formed of the conductive resin containing the conductive particles (conductive beads), as described above.

In addition, in the first non-transmission/reception region R2a, the feeding pin 72 is provided so as to be disposed at the center of a concentric circle formed by the slots 57. The microwaves are supplied to the waveguide 301 constituted by the slot electrode 55, the reflective conductive plate 65, and the dielectric substrate 51 by the feeding pin 72. The feeding pin 72 is connected to a feeding device 70. A feeding manner may be any one of a direct-coupling feeding manner and an electromagnetic coupling feeding manner, or a known feeding structure can be adopted.

Hereinafter, the TFT substrate 101, the slot substrate 201, and the waveguide 301 will be described in detail.

(Structure of TFT Substrate 101)

Figure 4:
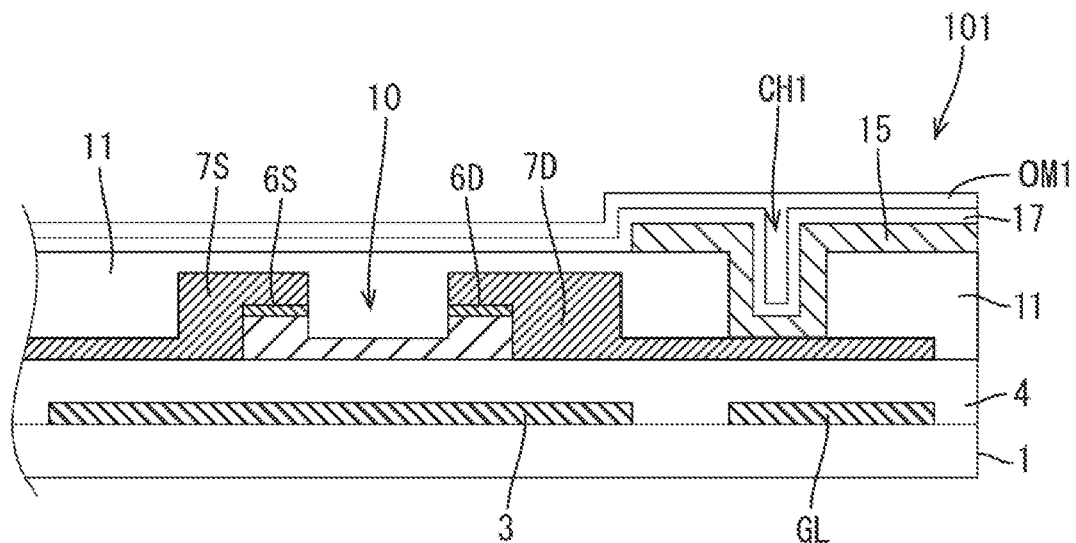
FIG. 4 is a cross-sectional view schematically showing an antenna unit region of the TFT substrate.
Figure 5:
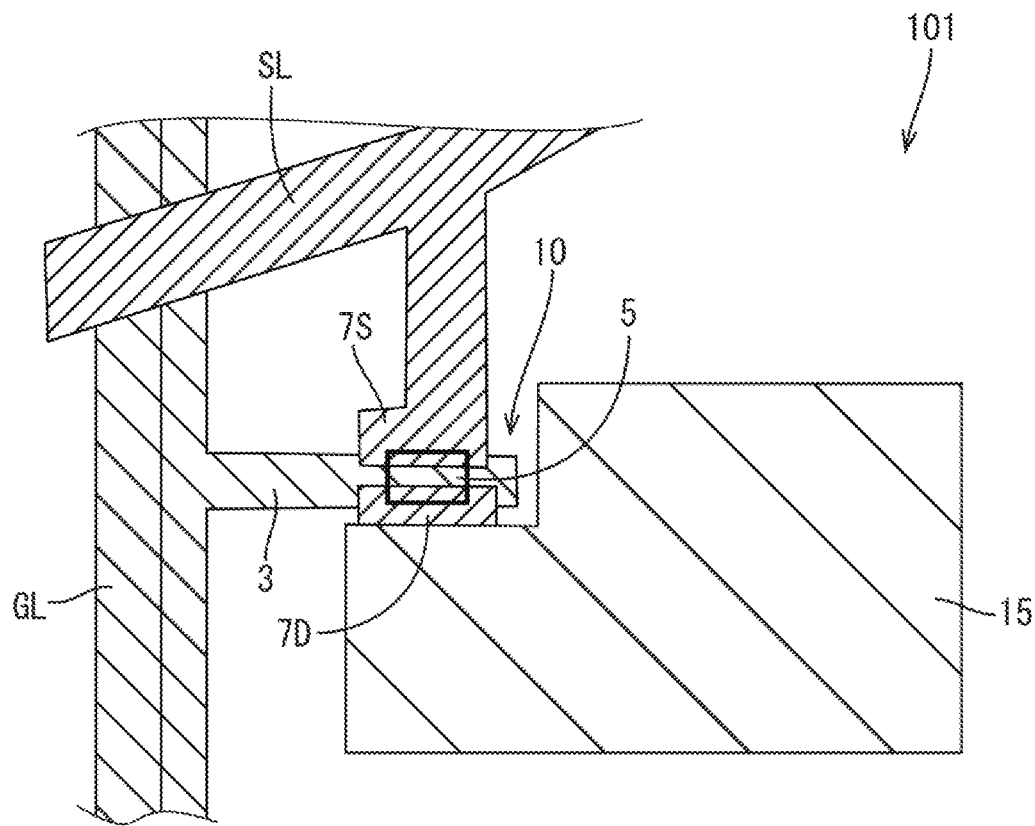
FIG. 5 is a plan view schematically showing the antenna unit region of the TFT substrate.

FIG. 4 is a cross-sectional view schematically showing the antenna unit region U of the TFT substrate 101, and FIG. 5 is a plan view schematically showing the antenna unit region U of the TFT substrate 101. In FIGS. 4 and 5, configurations of cross sections of a part of the transmission/reception region R1 are shown.

Each antenna unit region U of the TFT substrate 101 includes the dielectric substrate (first dielectric substrate) 1, the TFT 10 supported on the dielectric substrate 1, a first insulating layer 11 covering the TFT 10, the patch electrode 15 formed on the first insulating layer 11 and electrically connected to the TFT 10, a second insulating layer 17 covering the patch electrode 15, and the alignment film OM1 covering the second insulating layer 17.

The TFT 10 includes a gate electrode 3, a semiconductor layer 5 having an island shape, a gate insulating layer 4 disposed between the gate electrode 3 and the semiconductor layer 5, a source electrode 7S, and a drain electrode 7D. The TFT 10 according to the present embodiment is a channel etch type TFT having a bottom gate structure. It should be noted that TFTs having other structures may be used in another embodiment.

The gate electrode 3 is electrically connected to the gate bus line GL, and receives a scanning signal supplied from the gate bus line GL. The source electrode 7S is electrically connected to the source bus line SL, and receives a data signal supplied from the source bus line SL. The gate electrode 3 and the gate bus line GL may be formed of the same conductive film (gate conductive film). In addition, the source electrode 7S, the drain electrode 7D, and the source bus line SL may be formed of the same conductive film (source conductive film). The gate conductive film and the source conductive film are, for example, metal films. A layer formed using the gate conductive film may be referred to as a "gate metal layer", and a layer formed using the source conductive film may be referred to as a "source metal layer".

The semiconductor layer 5 is disposed so as to overlap with the gate electrode 3 with the gate insulating layer 4 interposed therebetween. As shown in FIG. 4, a source contact layer 6S and a drain contact layer 6D are formed on the semiconductor layer 5. The source contact layer 6S and the drain contact layer 6D are disposed, respectively, at both sides of a region (channel region) in which a channel is formed in the semiconductor layer 5, so as to face each other. In the present embodiment, the semiconductor layer 5 is an intrinsic amorphous silicon (i-a-Si) layer, and the source contact layer 6S and the drain contact layer 6D are an $n^+$-type amorphous silicon ($n^+$-a-Si) layer. It should be noted that the semiconductor layer 5 may be a polysilicon layer, an oxide semiconductor layer, or the like, in another embodiment.

The source electrode 7S is provided so as to be in contact with the source contact layer 6S, and is connected to the semiconductor layer 5 through the source contact layer 6S. The drain electrode 7D is provided so as to be in contact with the drain contact layer 6D, and is connected to the semiconductor layer 5 through the drain contact layer 6D.

The first insulating layer 11 has a contact hole CH1 reaching the drain electrode 7D of the TFT 10.

The patch electrode 15 is provided on the first insulating layer 11 and in the contact hole CH1, and is in contact with the drain electrode 7D in the contact hole CH1. The patch electrode 15 is mainly formed of a metal layer. It should be noted that the patch electrode 15 may be a metal electrode formed of only a metal layer. A material of the patch electrode 15 may be the same as those of the source electrode 7S and the drain electrode 7D. A thickness of the metal layer in the patch electrode 15 (a thickness of the patch electrode 15 in a case where the patch electrode 15 is the metal electrode) may be the same as those of the source electrode 7S and the drain electrode 7D, but is preferably larger than those of the source electrode 7S and the drain electrode 7D. When the thickness of the patch electrode 15 is large, transmittance of the electromagnetic wave is suppressed to be low, such that a sheet resistance of the patch electrode is reduced, and loss that vibrations of free electrons in the patch electrode are changed to heat is reduced.

In addition, a CS bus line CL may be provided using the same conductive film as that of the gate bus line GL. The CS bus line CL may be disposed so as to overlap with the drain electrode 7D (or an extending portion of the drain electrode 7D) with the gate insulating layer 4 interposed therebetween to constitute an auxiliary capacitance CS having the gate insulating layer 4 as a dielectric layer.

In the present embodiment, the patch electrode 15 is formed in a layer different from the source metal layer. For this reason, a thickness of the source metal layer and a thickness of the patch electrode 15 can be controlled independently of each other.

The patch electrode 15 may include a Cu layer or an Al layer as a main layer. Performance of the scanning antenna is correlated with an electric resistance of the patch electrode 15, such that a thickness of the main layer of the patch electrode 15 is set so as to obtain a desired resistance. It is preferable that the patch electrode 15 have a resistance low enough not to hinder vibrations of electrons. The thickness of the metal layer in the patch electrode 15 is set to, for example, 0.5 μm or more when the metal layer is an Al layer.

The alignment film OM1 is formed of a polyimide-based resin. Details of the alignment film OM1 will be described below.

The TFT substrate 101 is produced by, for example, a method to be described below. First, the dielectric substrate 1 is prepared. For example, a glass substrate, a plastic substrate having heat resistance, or the like can be used as the dielectric substrate 1. The gate metal layer including the gate electrode 3 and the gate bus line GL is formed on the dielectric substrate 1.

The gate electrode 3 can be formed integrally with the gate bus line GL. Here, the gate conductive film (of which a thickness is, for example, 50 nm or more to 500 nm or less) is formed on the dielectric substrate 1 by a sputtering method or the like. Then, the gate electrode 3 and the gate bus line GL are formed by patterning the gate conductive film. A material of the gate conductive film is not particularly limited, and can be a metal such as aluminum (Al), tungsten (W), molybdenum (Mo), tantalum (Ta), chromium (Cr), titanium (Ti), copper (Cu), or the like, or alloys or nitrides thereof. Here, a laminated film in which MoN (of which a thickness is, for example, 50 nm), Al (of which a thickness is, for example, 200 nm), and MoN (of which a thickness is, for example, 50 nm) are sequentially laminated is formed as the gate conductive film.

Then, the gate insulating layer 4 is formed so as to cover the gate metal layer. The gate insulating layer 4 can be formed by a chemical vapor deposition (CVD) method or the like. A silicon oxide ($SiO_2$) layer, a silicon nitride (SiNx) layer, a silicon oxynitride (SiOxNy; x>y) layer, a silicon nitride oxide (SiNxOy; x>y) layer, or the like may be appropriately used as the gate insulating layer 4. The gate insulating layer 4 may have a laminated structure. Here, a SiNx layer (of which a thickness is, for example, 410 nm) is formed as the gate insulating layer 4.

Then, the semiconductor layer 5 and a contact layer are formed on the gate insulating layer 4. Here, the semiconductor layer 5 having the island shape and the contact layer are obtained by sequentially forming and patterning an intrinsic amorphous silicon film (of which a thickness is, for example, 125 nm) and an $n^+$-type amorphous silicon film (of which a thickness is, for example, 65 nm). It should be noted that a semiconductor film used in the semiconductor layer 5 is not limited to the amorphous silicon film. For example, an oxide semiconductor layer may be formed as the semiconductor layer 5. In this case, the contact layer may not be provided between the semiconductor layer 5 and the source and drain electrodes.

Then, the source metal layer including the source electrode 7S, the drain electrode 7D, and the source bus line SL is formed by forming the source conductive film (of which a thickness is, for example, 50 nm or more to 500 nm or less) on the gate insulating layer 4 and the contact layer and patterning the source conductive film. In this case, the contact layer is also etched, such that the source contact layer 6S and the drain contact layer 6D separated from each other are formed.

A material of the source conductive film is not particularly limited, and can be a metal such as aluminum (Al), tungsten (W), molybdenum (Mo), tantalum (Ta), chromium (Cr), titanium (Ti), copper (Cu), or the like, or alloys or nitrides thereof. Here, a laminated film in which MoN (of which a thickness is, for example, 30 nm), Al (of which a thickness is, for example, 200 nm), and MoN (of which a thickness is, for example, 50 nm) are sequentially laminated is formed as the source conductive film.

Here, the source conductive film is formed by, for example, a sputtering method, and patterning (source/drain separation) of the source conductive film is performed by wet etching. Then, a portion of the contact layer positioned on a region that becomes the channel region of the semiconductor layer 5 is removed by, for example, dry etching to form a gap portion, thereby separating the contact layer into the source contact layer 6S and the drain contact layer 6D. In this case, in the gap portion, the vicinity of a surface of the semiconductor layer 5 is also etched (over etching).

Then, the first insulating layer 11 is formed so as to cover the TFT 10. In this example, the first insulating layer 11 is disposed so as to be in contact with the channel region of the semiconductor layer 5. In addition, the contact hole CH1 reaching the drain electrode 7D is formed in the first insulating layer 11 by a known photolithography technology.

The first insulating layer 11 may be an inorganic insulating layer such as a silicon oxide ($SiO_2$) film, a silicon nitride (SiNx) film, a silicon oxynitride (SiOxNy; x>y) film, a silicon nitride oxide (SiNxOy; x>y) film, or the like. Here, a SiNx layer having a thickness of, for example, 330 nm is formed as the first insulating layer 11 by, for example, a CVD method.

Then, a patch conductive film is formed on the first insulating layer 11 and in the contact hole CH1, and is patterned. As a result, the patch electrode 15 is formed in the transmission/reception region R1. It should be noted that a patch connection portion formed of the same conductive film (patch conductive film) as that of the patch electrode 15 is formed in the non-transmission/reception region R2. The patch electrode 15 is in contact with the drain electrode 7D within the contact hole CH1.

The same material as that of the gate conductive film or the source conductive film can be used as a material of the patch conductive film. However, it is preferable that the patch conductive film be set to be thicker than the gate conductive film and the source conductive film. An appropriate thickness of the patch conductive film is, for example, 1 μm or more to 30 μm or less. When the thickness of the patch conductive film is smaller than 1 μm, transmittance of the electromagnetic wave becomes about 30%, and a sheet resistance becomes 0.03 Ω/sq or more, such that it is likely that loss is increased, and the thickness of the patch conductive film is larger than 30 μm, it is likely that patterning characteristics of the slot 57 will be deteriorated.

Here, a laminated film (MoN/Al/MoN) in which MoN (of which a thickness is, for example, 50 nm), Al (of which a thickness is, for example, 1000 nm), and MoN (of which a thickness is, for example, 50 nm) are sequentially laminated is formed as the patch conductive film.

Then, the second insulating layer (of which a thickness is, for example, 100 nm or more to 300 nm or less) 17 is formed on the patch electrode 15 and the first insulating layer 11. The second insulating layer 17 is not particularly limited, and can be, for example, a silicon oxide ($SiO_2$) film, a silicon nitride (SiNx) film, a silicon oxynitride (SiOxNy; x>y) film, a silicon nitride oxide (SiNxOy; x>y) film, or the like. Here, for example, a SiNx layer having a thickness of 200 nm is formed as the second insulating layer 17.

Then, inorganic insulating films (the second insulating layer 17, the first insulating layer 11, and the gate insulating layer 4) are collectively etched by, for example, dry etching using a fluorine-based gas. In the etching, the patch electrode 15, the source bus line SL, and the gate bus line GL function as an etch stop. Therefore, a second contact hole reaching the gate bus line GL is formed in the second insulating layer 17, the first insulating layer 11, and the gate insulating layer 4, and a third contact hole reaching the source bus line SL is formed in the second insulating layer 17 and the first insulating layer 11. In addition, a fourth contact hole reaching the patch connection portion described above is formed in the second insulating layer 17.

Then, a conductive film (of which a thickness is 50 nm or more to 200 nm or less) is formed on the second insulating layer 17 and in the second contact hole, the third contact hole, and the fourth contact hole by, for example, a sputtering method. A transparent conductive film such as an indium tin oxide (ITO) film, an IZO film, a zinc oxide film (ZnO film), or the like can be used as the conductive film. Here, an ITO film having a thickness of, for example, 100 nm is used as the conductive film.

Then, an upper connection portion for a gate terminal, an upper connection portion for a source terminal, and an upper connection portion for a transfer terminal are formed by patterning the transparent conductive film. The upper connection portion for a gate terminal, the upper connection portion for a source terminal, and the upper connection portion for a transfer terminal are used in order to protect the electrodes or wirings exposed at each terminal portion. In this way, the gate terminal portion GT, the source terminal portion ST, and the transfer terminal portion PT are obtained.

Then, the alignment film OM1 is formed so as to cover the second insulating layer 17 and the like. Details of the alignment film OM1 will be described below. In this way, the TFT substrate 101 can be produced.

(Structure of Slot Substrate 201)

Figure 6:
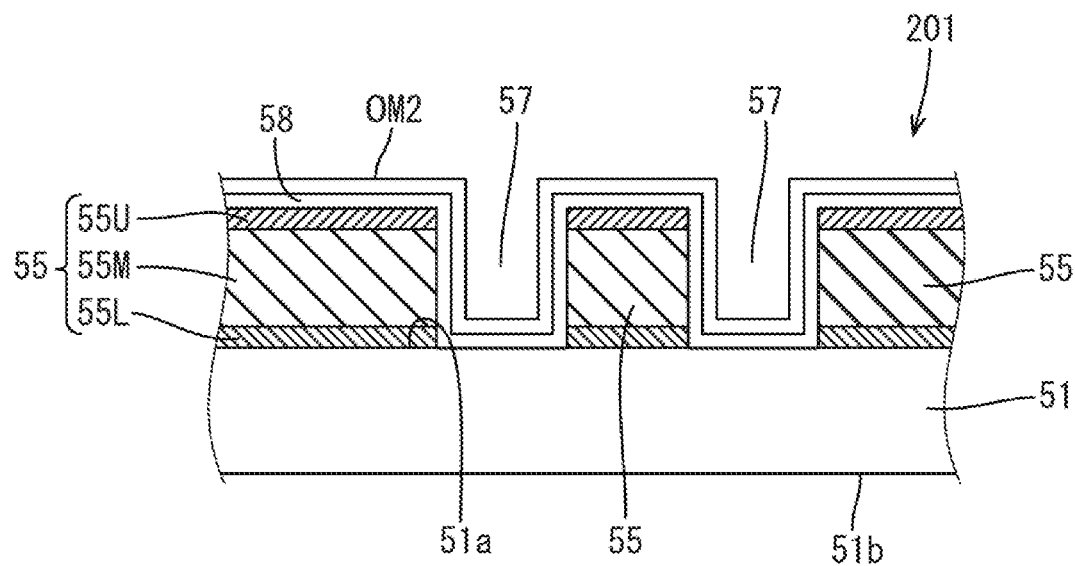
FIG. 6 is a cross-sectional view schematically showing an antenna unit region of the slot substrate.

Next, a structure of the slot substrate 201 will be described in more detail. FIG. 6 is a cross-sectional view schematically showing the antenna unit region U of the slot substrate 201.

The slot substrate 201 mainly includes the dielectric substrate (the second dielectric substrate) 51, the slot electrode 55 formed on one plate surface (a plate surface facing the liquid crystal layer or a plate surface facing the TFT substrate 101) 51a of the dielectric substrate 51, a third insulating layer 58 covering the slot electrode 55, and the alignment film OM2 covering the third insulating layer 58.

In the transmission/reception region R1 of the slot substrate 201, the slots 57 are formed in the slot electrode 55 (see FIG. 2). The slot 57 is an opening (groove) penetrating through the slot electrode 55. In this example, one slot 57 is assigned to each antenna unit region U.

The slot electrode 55 includes a main layer 55M such as a Cu layer, an Al layer, or the like. The slot electrode 55 may have a laminated structure in which it includes the main layer 55M and an upper layer 55U and a lower layer 55L disposed with the main layer 55M interposed therebetween. A thickness of the main layer 55M may be set in consideration of a skin effect depending on a material, and may be, for example, 2 μm or more to 30 μm or less. The thickness of the main layer 55M is typically set to be larger than those of the upper layer 55U and the lower layer 55L.

In this example, the main layer 55M is a Cu layer, and the upper layer 55U and the lower layer 55L are Ti layers. Adhesion between the slot electrode 55 and the dielectric substrate 51 can be improved by disposing the lower layer 55L between the main layer 55M and the dielectric substrate 51. In addition, corrosion of the main layer 55M (for example, the Cu layer) can be suppressed by providing the upper layer 55U.

The third insulating layer 58 is formed on the slot electrode 55 and in the slot 57. A material of the third insulating layer 58 is not particularly limited, and can be, for example, a silicon oxide ($SiO_2$) film, a silicon nitride (SiNx) film, a silicon oxynitride (SiOxNy; x>y) film, or a silicon nitride oxide (SiNxOy; x>y) film, or the like.

The alignment film OM2 is formed of a polyimide-based resin, similar to the alignment film OM1 formed on the TFT substrate 101. Details of the alignment film OM2 will be described below.

It should be noted that the terminal portions IT are provided in the non-transmission/reception region R2 of the slot substrate 201 (see FIG. 3). The terminal portion IT includes a part of the slot electrode 55, the third insulating layer 58 covering a part of the slot electrode 55, and an upper connection portion. The third insulating layer 58 has an opening (contact hole) reaching a part of the slot electrode 55. The upper connection portion is in contact with a part of the slot electrode 55 in the opening. In the present embodiment, the terminal portion IT is formed of a conductive layer such as an ITO film, an IZO film, or the like, is disposed in the seal region Rs, and is connected to the transfer terminal portion PT in the TFT substrate 101 by a seal resin containing conductive particles (for example, conductive beads such as Au beads, or the like).

The slot substrate 201 is produced by, for example, a method to be described below. First, the dielectric substrate 51 is prepared. A substrate having a high transmittance (a dielectric constant εM and a dielectric loss tan δM are small) for the electromagnetic wave, such as a glass substrate, or a resin substrate can be used as the dielectric substrate 51. It is preferable that the dielectric substrate 51 is as thin as possible in order to suppress attenuation of the electromagnetic wave. For example, after components such as the slot electrode 55 and the like are formed on a surface of the glass substrate by a process to be described below, the glass substrate may be thinned from a back surface thereof. As a result, a thickness of the glass substrate can be set to, for example, 500 μm or less. In general, a resin has a smaller dielectric constant εM and dielectric loss tan δM than those of a glass. When the dielectric substrate 51 is the resin substrate, a thickness of the dielectric substrate 51 is, for example, 3 μm or more to 300 μm or less. Polyimide or the like is used as a material of the resin substrate.

The slot electrode 55 having the slots 57 is obtained by forming a metal film on the dielectric substrate 51 and patterning the metal film. A Cu film (or an Al film) having a thickness of 2 μm or more to 5 μm or less may be used as the metal film. Here, a laminated film in which a Ti film, a Cu film, and a Ti film are sequentially laminated is used.

Then, the third insulating layer (of which a thickness is, for example, 100 nm or more to 200 nm or less) 58 is formed on the slot electrode 55 and in the slot 57. Here, the third insulating layer 52 is formed of a silicon oxide ($SiO_2$) film.

Then, in the non-transmission/reception region R2, the opening (contact hole) reaching a part of the slot electrode 55 is formed in the third insulating layer 58.

Then, a transparent conductive film is formed on the third insulating layer 58 and in the opening of the third insulating layer 58 and is patterned, such that an upper connection portion in contact with a part of the slot electrode 55 is formed in the opening, and a terminal portion IT for being connected to the transfer terminal portion PT of the TFT substrate 101 is obtained.

Then, the alignment film OM2 is formed so as to cover the third insulating layer 58. Details of the alignment film OM2 will be described below. In this way, the slot substrate 201 can be produced.

(Configuration of Waveguide 301)

The waveguide 301 is configured such that the reflective conductive plate 65 faces the slot electrode 55 with the dielectric substrate 51 interposed therebetween. The reflective conductive plate 65 is disposed so as to face a back surface of the dielectric substrate 51 with the air layer 54 interposed therebetween. Since the reflective conductive plate 65 constitutes the wall of the waveguide 301, it is preferable that the reflective conductive plate 65 have a thickness of three times or more, preferably, five times or more a skin depth. For example, an aluminum plate, a copper plate, or the like produced by cutting and having a thickness of several millimeters can be used as the reflective conductive plate 65.

For example, when the scanning antenna 1000 performs transmission, the waveguide 301 guides the microwaves supplied from the feeding pin 72 disposed at the centers of the antenna units U arranged concentrically so as to radially spread outward. When the microwaves move along the waveguide 301, the microwaves are cut off at each slot 57 of each antenna unit U, such that an electric field is generated by a principle of a so-called slot antenna, and electric charges are induced in the slot electrode 55 by an action of the electric field (that is, the microwaves are converted into vibrations of free electrons in the slot electrode 55). In each antenna unit U, a phase of vibrations of free electrons induced in the patch electrode 15 is controlled by changing a capacitance value of a liquid crystal capacitance through alignment control of a liquid crystal. When the electric charges are induced in the patch electrode 15, the electric field is generated (that is, the vibrations of the free electrons in the slot electrode 55 move to the vibrations of the free electrons in the patch electrode 15), and microwaves (radio waves) oscillate from the patch electrode 15 of each antenna unit U toward an outer side of the TFT substrate 101. An azimuth angle of a beam is controlled by adding together the microwaves (radio waves) oscillating from each antenna unit U and having different phases.

In another embodiment, the waveguide may have a two-layer structure in which it is divided into an upper layer and a lower layer. In this case, the microwaves supplied from the feeding pin first move in the lower layer so as to radially spread from the center of the lower layer toward an outer side of the lower layer, ascend to the upper layer at an outer wall portion of the lower layer, and then move in the upper layer so as to gather from an outer side of the upper layer to the center of the upper layer. By adopting such a two-layer structure, it becomes easy to uniformly spread the microwaves over each antenna unit U.

(Alignment Films OM (OM1 and OM2))

Examples of the alignment films OM1 and OM2 (hereinafter, sometimes collectively referred to as "alignment film OM") used for the TFT substrate 101 and the slot substrate 201 of the present embodiment may include an alignment film prepared by performing alignment treatment such as rubbing treatment on one obtained by imidizing a polyamic acid, which is represented by the following Chemical Formula (1), as represented by the following Chemical Formula (2). The alignment film OM is subjected to alignment treatment to express a function of aligning the liquid crystal compound in a predetermined direction.

[C 1]

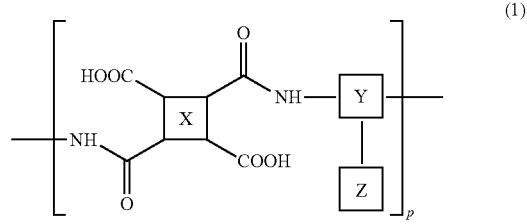

(1)

[C 2]

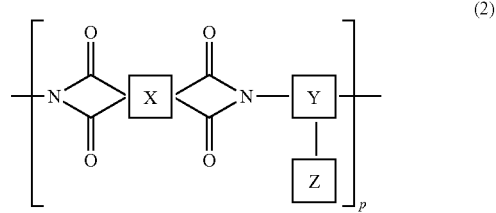

(2)

In the Chemical Formulas (1) and (2), p is an arbitrary natural number. In addition, in the chemical formulas (1) and (2), X has a structure represented by the following Chemical Formulas (3-1) to (3-16).

[C 3]

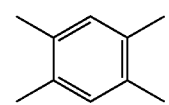

(3-1)

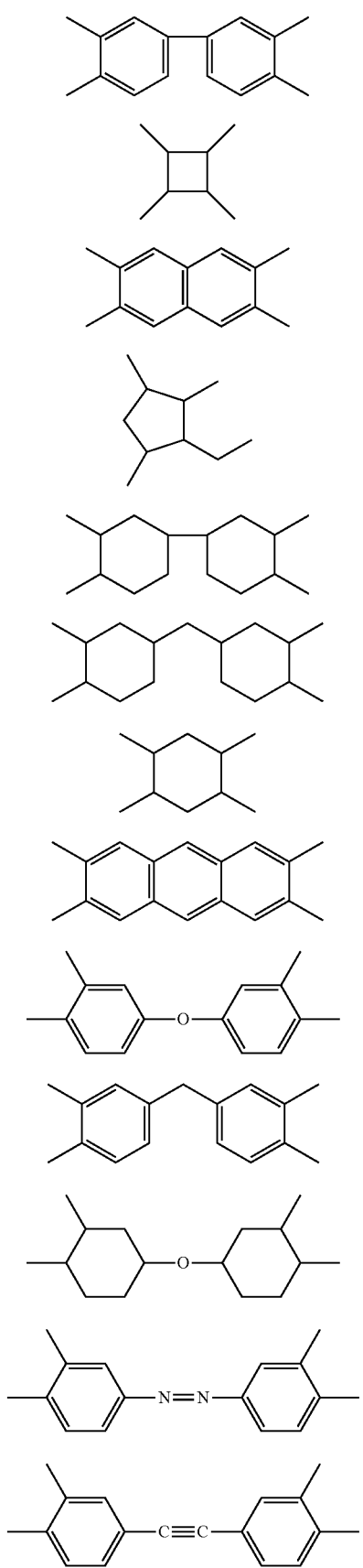
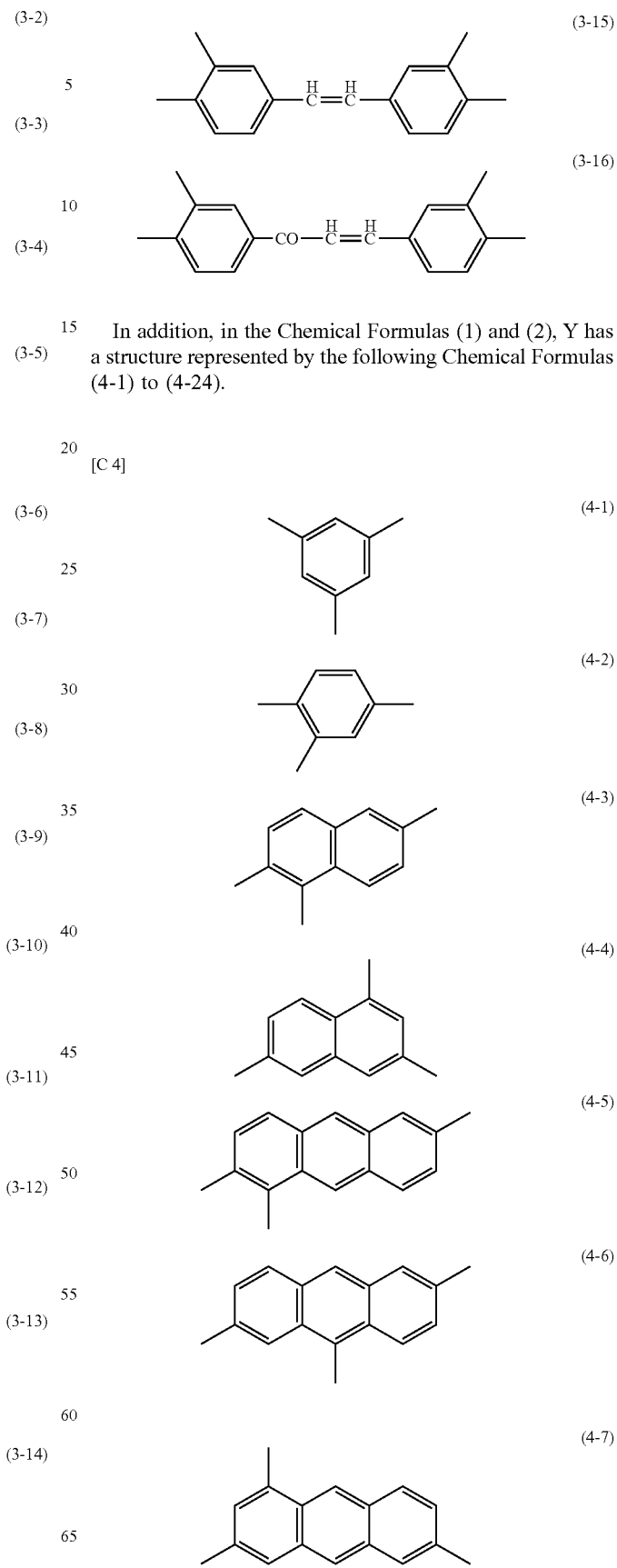
In addition, in the Chemical Formulas (1) and (2), Y has a structure represented by the following Chemical Formulas (4-1) to (4-24).
[C 4]

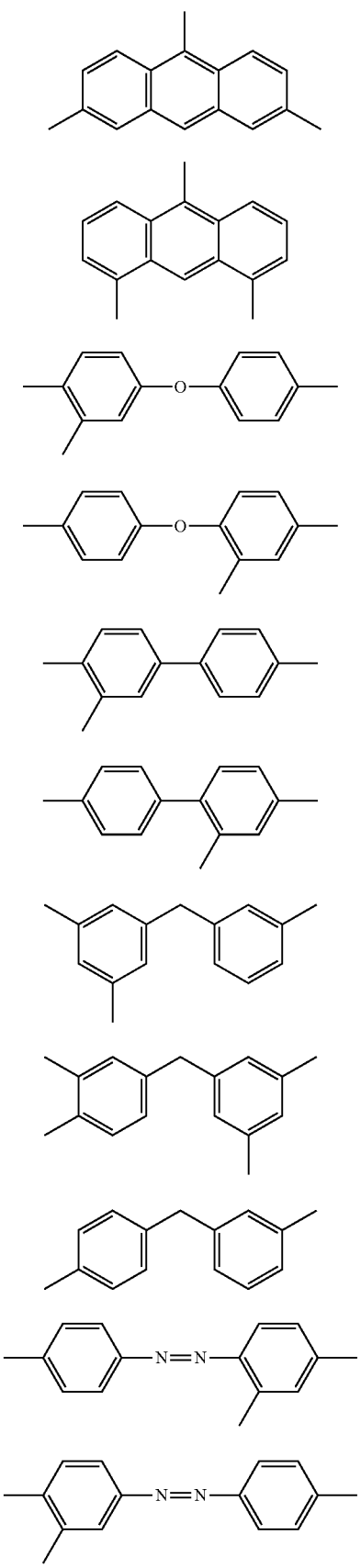
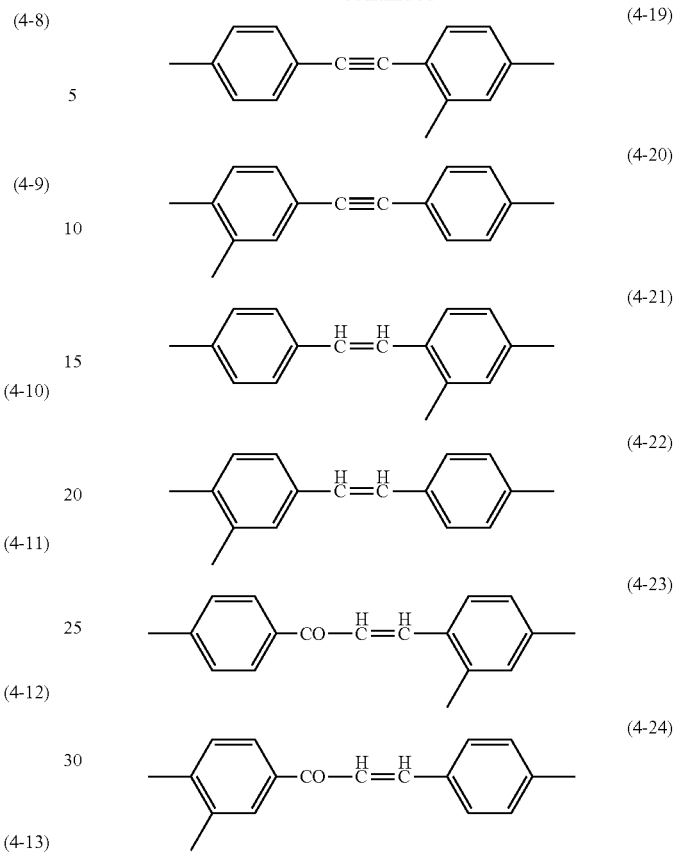

In addition, in the Chemical Formulas (1) and (2), Z represents a side chain. A structure of Z is not particularly limited as long as the structure of Z does not damage the object of the present invention. Z may be omitted. In the Chemical Formulas (1) and (2), when Z is absent, any two of the bonding groups of the above Chemical formulas (4-1) to (4-24) may be used.

The imidization of the polyamic acid represented by the above Chemical Formula (1) is carried out, for example, by heating the polyamic acid at a high temperature (for example, from 200 to 250° C.). In addition, for example, a chemical imidization method using acetic anhydride or the like as a dehydrating agent and using pyridine or the like as a catalyst may be used. The imidization ratio of the polyimide represented by the above Chemical Formula (2) is not particularly limited as long as the imidization ratio of the polyimide does not image the object of the present invention, but is preferably 50% or more, for example.

The alignment film OM may be a horizontal alignment film whose alignment direction is horizontal with respect to the substrate surface or a vertical alignment film whose alignment direction is perpendicular with respect to the substrate surface. However, when the alignment film OM is used in combination with the liquid crystal compound having the positive dielectric anisotropy in order to increase the variation in the capacitance of the liquid crystal cell, the horizontal alignment film is preferable as the alignment film OM.

A polymerization method of the polyamic acid is not particularly limited, but the known methods can be used. Further, the polyamic acid is appropriately dissolved in an organic solvent to be prepared as a liquid-state or sol-like composition (alignment agent) having fluidity.

In the present embodiment, the alignment films OM (alignment films OM1 and OM2) are formed on the surfaces of both the TFT substrate 101 and the slot substrate 201, but in another embodiment, the alignment film OM may be formed only on any one of the surfaces of the TFT substrate 101 and the slot substrate 201.

When the alignment film OM is formed, first, the uncured alignment agent having fluidity, which contains the polyamic acid represented by the above Chemical Formula (1), is coated on the surfaces of the respective substrates 101 and 201 by a coating machine. First, the coated product is pre-baked (for example, heat treatment at 80° C. for 2 minutes), followed by main baking (for example, heat treatment at 210° C. for 10 minutes). Thereafter, by performing the rubbing treatment on the coated product which is subjected to the main baking, the alignment film OM having alignment properties for aligning the liquid crystal compound in a predetermined direction is obtained. The polyamic acid is imidized at the time of the pre-baking or the main baking.

A relative dielectric constant, a film thickness, and a pretilt angle of the alignment film OM are appropriately set so as to be values to be described later.

(Liquid Crystal Layer LC (Liquid Crystal Compound))

An isothiocyanate group-containing liquid crystal compound having a large dielectric anisotropy (As) (for example, 10 or more) is used as the liquid crystal material (liquid crystal compound) constituting the liquid crystal layer. Examples of the isothiocyanate group-containing liquid crystal compound include those represented by the following Chemical Formulas (5-1) and (5-2).

[C 5]

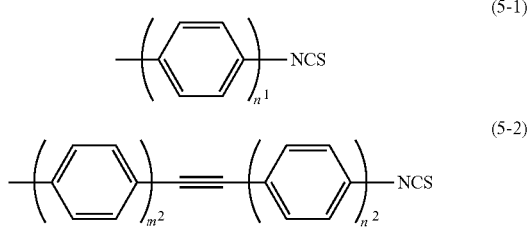

In the above Chemical Formulas (5-1) and (5-2), n1, m2, and n2 are each an integer of 1 to 5, and H in a phenylene group may be substituted with F or Cl.

As the liquid crystal material, the liquid crystal compound other than the isothiocyanate group-containing liquid crystal compound may be contained as long as the liquid crystal compound does not damage the object of the present invention.

(Antenna Unit U)

Figure 7:
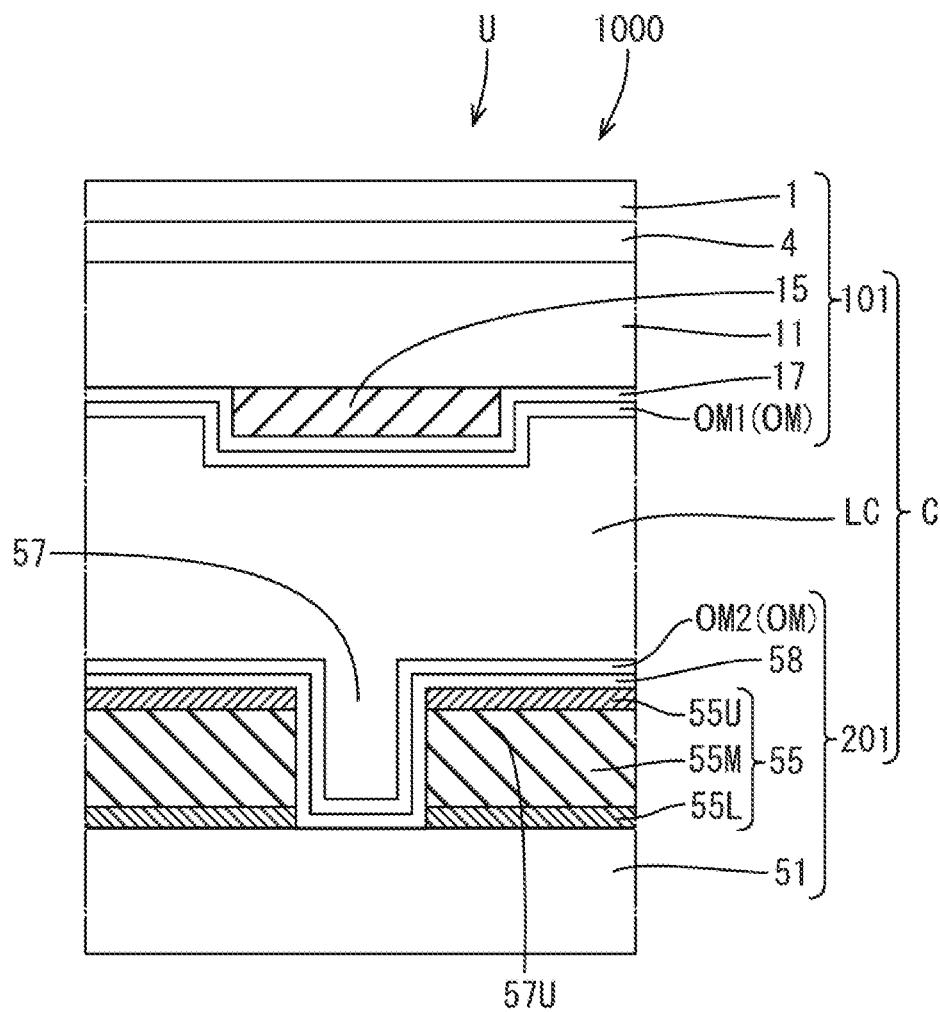
FIG. 7 is a cross-sectional view schematically showing a TFT substrate, a liquid crystal layer, and a slot substrate constituting an antenna unit of a scanning antenna.

FIG. 7 is a cross-sectional view schematically showing the TFT substrate 101, the liquid crystal layer LC, and the slot substrate 201 constituting the antenna unit U of the scanning antenna 1000. As shown in FIG. 7, in the antenna unit U, the island-shaped patch electrode 15 of the TFT substrate 101, and the hole-shaped (groove-shaped) slot 57 (slot electrode unit 57U) included in the slot electrode 55 of the slot substrate 201 face each other with the liquid crystal layer LC interposed therebetween. The scanning antenna 1000 includes a liquid crystal cell C that includes the liquid crystal layer LC and a pair of TFT substrate 101 and slot substrate 201 disposed with the liquid crystal layer LC interposed therebetween and includes the alignment films OM1 and OM2 disposed on surfaces of the TFT substrate 101 and the slot substrate 201 facing the liquid crystal layer LC, respectively. In the present description, the antenna unit U has a structure in which it includes one patch electrode 15 and the slot electrode 55 (slot electrode unit 57U) in which at least one slot 57 corresponding to the patch electrode 15 is disposed.

(Method of Producing Scanning Antenna)

At the time of producing the scanning antenna, a process of bonding the TFT 101 and the slot substrate 201 with a sealing material interposed therebetween and a process of filling a liquid crystal layer LC between the TFT substrate 101 and the slot substrate 201 are performed. The liquid crystal material (liquid crystal compound) constituting the liquid crystal layer LC may be filled between the TFT substrate 101 and the slot substrate 201 by a one drop fill (ODF) method or may be filled between the TFT substrate 101 and the slot substrate 201 by a vacuum injection method. In this way, the liquid crystal cell C of the scanning antenna 1000 including the liquid crystal layer LC, the TFT substrate 101, and the slot substrate 201 can be obtained.

After the liquid crystal cell C is produced as described above, the reflective conductive plate 65 is appropriately assembled to the liquid crystal panel so as to face an opposite surface 51b of the slot substrate 201 (second dielectric substrate 51) with the dielectric layer (air layer) interposed therebetween. Through such processes, the scanning antenna according to the present embodiment is produced.

(Liquid Crystal Cell C)

Figure 8:
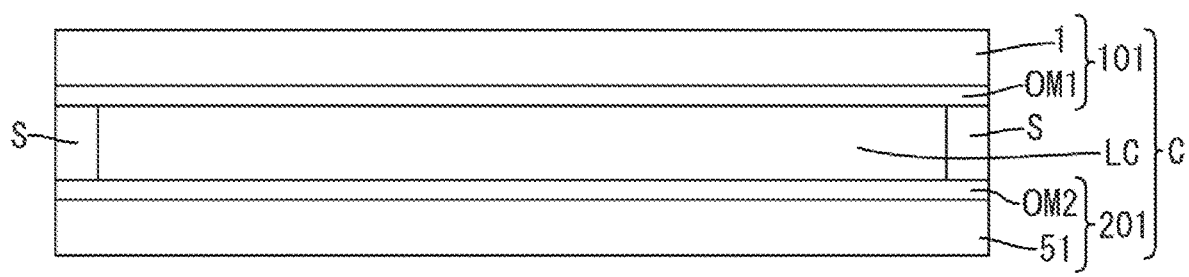
FIG. 8 is a cross-sectional view schematically showing a configuration of a liquid crystal cell.

FIG. 8 is a cross-sectional view schematically showing the configuration of the liquid crystal cell C. The TFT substrate 101 and the slot substrate 201 of the liquid crystal cell C are arranged in a form that a patch electrode and a slot electrode face each other, and the liquid crystal layer LC is interposed between the TFT substrate 101 and the slot substrate 201. In addition, a sealing material S surrounding the liquid crystal layer LC is disposed between the TFT substrate 101 and the slot substrate 201 constituting the liquid crystal cell C. The sealing material S has a function of bonding to the TFT substrate 101 and the slot substrate 201, respectively, and bonding the TFT substrate 101 and the slot substrate 201 to each other. The sealing material S is made of a cured product of a sealing material composition containing a curable resin.

The alignment film OM1 is formed on the surface of the TFT substrate 101 facing the liquid crystal layer LC (patch electrode), and the alignment film OM2 is formed on the surface of the slot substrate 201 facing the liquid crystal layer LC (slot electrode).

As described above, such a liquid crystal cell C includes antenna units U, and each antenna unit U includes one patch electrode 15 and a slot electrode 55 including at least one of the slots 57 arranged in a form corresponding to the one patch electrode 15 (see FIG. 7).

In the liquid crystal cell C, since the relative dielectric constant of the alignment film OM used, the thickness of the alignment film OM, the pretilt angle of the alignment film OM, a thickness of the cell of the liquid crystal cell C, an electrode overlap, and a slot width are set as follows, a difference (variation ΔC in capacitance) between the capacitance when no voltage is applied and the capacitance when a voltage is applied between the patch electrode 15 and the slot electrode 55 is increased.

The relative dielectric constant of the alignment film OM (OM1 and OM2) is set to 3.8 or more and preferably 4.2 or more in order to secure a large variation ΔC in capacitance. The relative dielectric constant of the alignment film OM is measured by the known methods such as a parallel flat plate (capacitance) method and a cavity resonator method.

The alignment film OM (OM1 and OM2) preferably has a thickness of 0.24 μm (240 nm) or less, more preferably 0.18 μm (180 nm) or less, and still more preferably 0.12 μm (120 nm) or less.

The thickness of the alignment film OM1 formed on the TFT substrate 101 and the thickness of the alignment film OM2 formed on the slot substrate 201 may be the same as each other or may be different from each other. However, when the thicknesses of the alignment films are different from each other, it is preferable that both the alignment films are set to have a thickness of 0.18 μm (180 nm) or less.

In the liquid crystal cell C of the present embodiment, the alignment film OM is formed on both the TFT substrate 101 and the slot substrate 201, but in another embodiment, the alignment film OM may be formed only on any one of the TFT substrate 101 and the slot substrate 201. In that case, the alignment film OM is preferably set to have a thickness of 0.12 μm (120 nm) or less.

Figure 9:
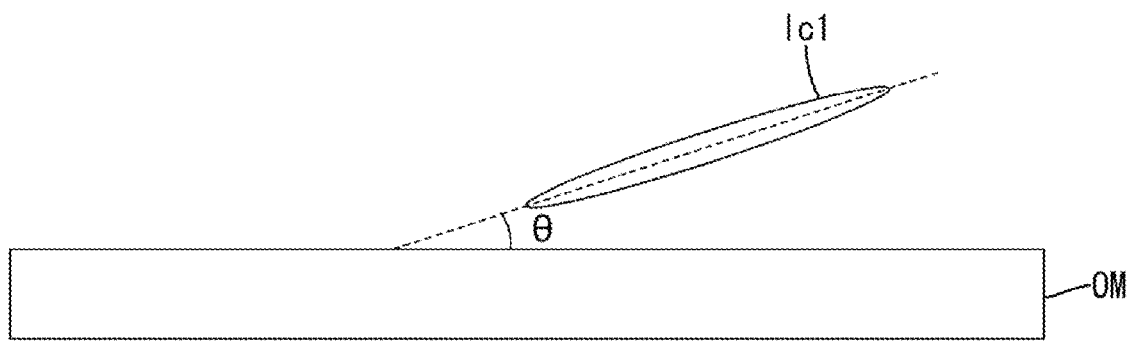
FIG. 9 is a diagram for describing a pretilt angle.

The pretilt angle of the alignment film OM of the liquid crystal cell C is preferably 1° or less. FIG. 9 is an explanatory diagram of the pretilt angle. In FIG. 9, the pretilt angle is an angle θ (°) at which the liquid crystal compound (liquid crystal molecule) lc1 in the liquid crystal layer is inclined with respect to the surface of the alignment film OM formed on the substrate when no voltage is applied.

As long as the pretilt angle of the alignment film OM can be set to 1° or less, as the material constituting the alignment film OM, other resins (for example, an acrylic resin) may be used without being limited to the above-described polyimide-based resin (for example, Chemical Formula (2)). In addition, even the alignment treatment on the alignment film OM may also be a photo alignment treatment or rubbing treatment as long as the pretilt angle can be set to 1° or less. For the measurement of the pretilt angle, the known technique such as a crystal rotation method is used.

The thickness of the cell of the liquid crystal cell C is preferably 4.8 μm or less, and more preferably 3.9 μm or less. When the alignment film OM is formed on both the TFT substrate 101 and the slot substrate 201, the thickness of the cell of the liquid crystal cell C is a distance between the surface of the alignment film OM1 formed on the patch electrode 15 of the TFT substrate 101 and the surface of the alignment film OM2 formed on the slot electrode 55 of the slot substrate 201. In addition, when the alignment film OM is formed on any one of the TFT substrate 101 and the slot substrate 201, the thickness of the cell of the liquid crystal cell C is a distance between the surface of the alignment film OM and the surface of the electrode (patch electrode 15 or slot electrode 55) of the substrate on which the alignment film OM is not formed.

The electrode overlap in the liquid crystal cell C has a length at which the patch electrode 15 and the slot electrode 55 overlap each other in one antenna unit U of the liquid crystal cell C. The electrode overlap is preferably 30 μm or more. Details of the electrode overlap will be described below.

In addition, the width of the slot in the liquid crystal cell C is preferably set to be in a range of 60 μm or more.

Example

Hereinafter, the present invention will be described in more detail based on examples. It should be noted that the present invention is not limited at all by these examples.

[Evaluation of Variation (ΔC) in Capacitance of Liquid Crystal Cell C]

Figure 10:
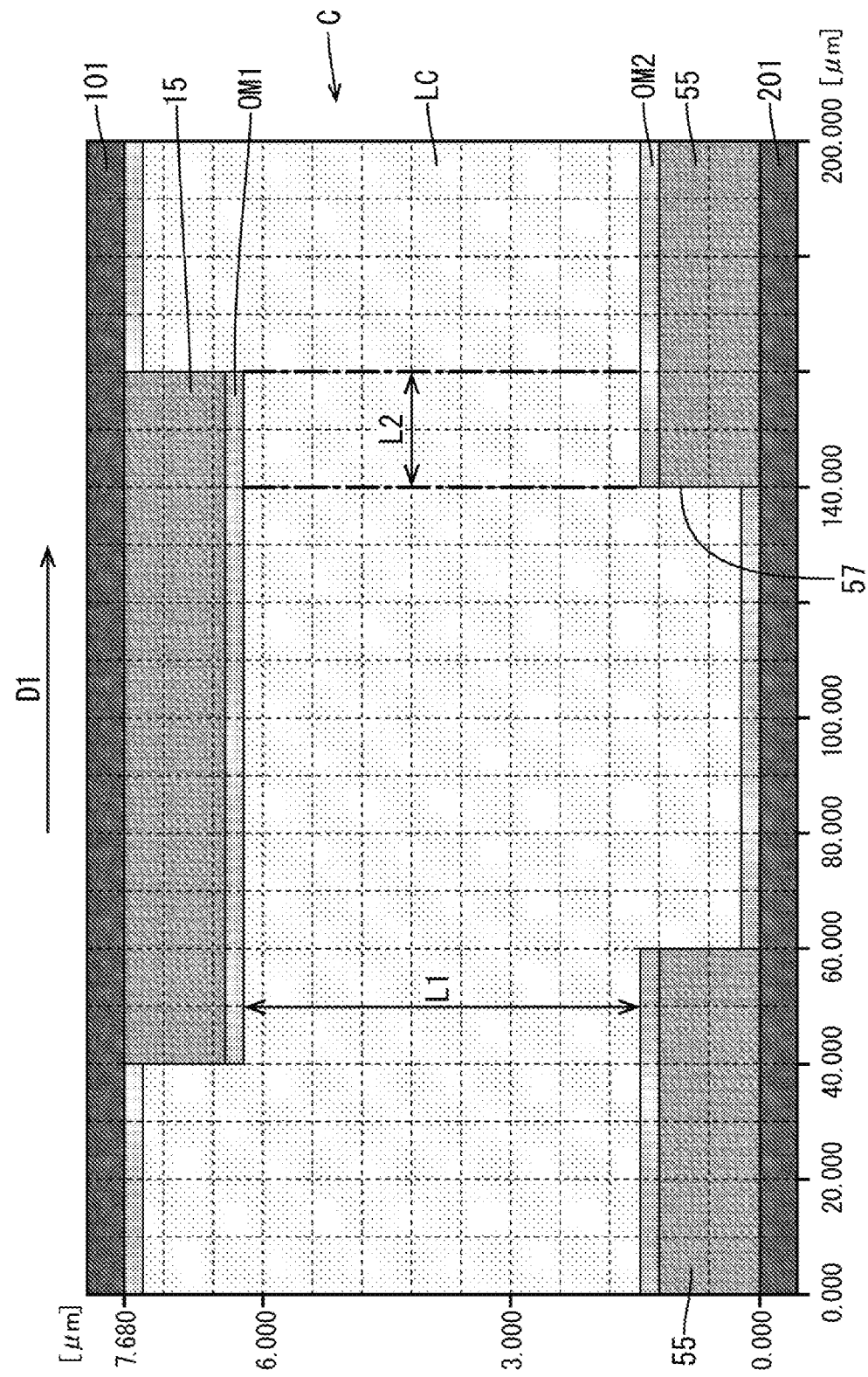
FIG. 10 is a diagram for describing a structure of the liquid crystal cell used for simulation.

As shown in FIG. 10, an alignment calculation was performed using a simulator (product name "LCDMaster 2D", manufactured by Shintech, Inc.) under the assumption that a liquid crystal cell C has a bilaterally symmetrical two-dimensional structure. Hereinafter, conditions of the simulation will be described with reference to FIG. 10.

FIG. 10 is a diagram for describing a structure of the liquid crystal cell C used for simulation. FIG. 10 shows the liquid crystal cell C including a TFT substrate 101 having a patch electrode 15 and a slot substrate 201 having a slot electrode 55. A liquid crystal layer LC is interposed between the TFT substrate 101 and the slot substrate 201. Horizontal alignment films (alignment films OM1 and OM2) each having a predetermined thickness are produced on surfaces on which the TFT substrate 101 and the slot substrate 201 are in contact with the liquid crystal layer LC.

In addition, the patch electrode 15 of the TFT substrate 101 was set to have a width of 120.0 μm, and a distance (that is, the width of the slot 57) between adjacent slot electrodes 55 and 55 of the slot substrate 201 was set to 80.0 μm.

In FIG. 10, a thickness of the cell (μm) of the liquid crystal cell C is indicated by L1, and a length (electrode overlap) at which the patch electrode 15 of the TFT substrate 101 and the slot electrode 55 of the slot substrate 201 overlap each other is indicated by L2.

In physical property values of the liquid crystal layer LC, Δε=15 (major axis direction: 20, minor axis direction: 5), viscosity γ1=0.18 Pa·s, K11=15 pN, K22=5 pN, and K33=20 pN. Further, a direction of an arrow 0 (rightward) shown in FIG. 10 was set as an alignment direction of a liquid crystal compound in the liquid crystal layer LC.

Under the above conditions, the alignment of the liquid crystal compound was simulated when 0 V is constantly applied to the slot electrode 55 and 0 V and 15 V are applied to the patch electrode 15. From the simulation, the capacitances C (0 V) and C (15 V) between the slot electrode and the patch electrode at an applied voltage of 0 V and 15 V are calculated on a simulator, and a difference ΔC therebetween is set to (C (15 V)–C (0 V)).

As shown in Tables 1 and 2, in the liquid crystal cell C, "a relative dielectric constant of the alignment film", "a pretilt angle)(° of the liquid crystal", "the thickness of the cell L1 (μm)", and "the electrode overlap L2 (μm)" are changed as parameters, the simulations of Examples 1 to 15 and Comparative Examples 1 to 3 were carried out.

In Examples 1 to 7 and 9 to 15, the alignment film made of a polyimide-based resin was used, and in Example 8 and Comparative Examples 1 to 3, the alignment film made of an acrylic resin was used.

TABLE 1

| | ALIGNMENT FILM OM2 ON SLOT SUBSTRATE SIDE | | | | ALIGNMENT FILM OM1 ON TFT SUBSTRATE SIDE | | | |
|---|---|---|---|---|---|---|---|---|
| | MATERIAL | FILM THICKNESS (μm) | RELATIVE DIELECTRIC CONSTANT | PRETILT ANGLE (°) | MATERIAL | FILM THICKNESS (μm) | RELATIVE DIELECTRIC CONSTANT | PRETILT ANGLE (°) |
| EXAMPLE 1 | POLYIMIDE | 0.24 | 3.8 | 5 | POLYIMIDE | 0.24 | 3.8 | 5 |
| EXAMPLE 2 | POLYIMIDE | 0.24 | 4.2 | 5 | POLYIMIDE | 0.24 | 4.2 | 5 |
| EXAMPLE 3 | POLYIMIDE | 0.18 | 4.2 | 5 | POLYIMIDE | 0.18 | 4.2 | 5 |
| EXAMPLE 4 | POLYIMIDE | 0.12 | 4.2 | 5 | POLYIMIDE | 0.18 | 4.2 | 5 |
| EXAMPLE 5 | POLYIMIDE | 0.12 | 4.2 | 5 | POLYIMIDE | 0 | — | — |
| EXAMPLE 6 | POLYIMIDE | 0.18 | 4.2 | 5 | POLYIMIDE | 0.18 | 4.2 | 5 |
| EXAMPLE 7 | POLYIMIDE | 0.18 | 4.2 | 5 | POLYIMIDE | 0.18 | 4.2 | 5 |
| COMPARATIVE EXAMPLE 1 | ACRYLIC | 0.24 | 2.6 | 5 | ACRYLIC | 0.24 | 2.6 | 5 |
| COMPARATIVE EXAMPLE 2 | ACRYLIC | 0.24 | 2.9 | 5 | ACRYLIC | 0.24 | 2.9 | 5 |
| COMPARATIVE EXAMPLE 3 | ACRYLIC | 0.24 | 3.2 | 5 | ACRYLIC | 0.24 | 3.2 | 5 |

| | CELL THICKNESS L1 (μm) | ELECTRODE OVERLAP L2 (μm) | CAPACITANCE (pF) | | |
|---|---|---|---|---|---|
| | | | C (0 V) | C (15 V) | Δ C |
| EXAMPLE 1 | 4.8 | 20 | 983.238 | 2016.435 | 1078.2 |
| EXAMPLE 2 | 4.8 | 20 | 1025.54 | 2168.429 | 1142.9 |
| EXAMPLE 3 | 4.8 | 20 | 1000.98 | 2186.371 | 1185.4 |
| EXAMPLE 4 | 4.8 | 20 | 1019.85 | 2323.082 | 1303.2 |
| EXAMPLE 5 | 4.8 | 20 | 822.617 | 2196.456 | 1373.8 |
| EXAMPLE 6 | 3.9 | 20 | 1121.2 | 2430.364 | 1309.2 |
| EXAMPLE 7 | 3.9 | 30 | 1266.25 | 3017.055 | 1750.8 |
| COMPARATIVE EXAMPLE 1 | 4.8 | 20 | 838.208 | 1685.541 | 847.33 |
| COMPARATIVE EXAMPLE 2 | 4.8 | 20 | 877.508 | 1788.737 | 911.23 |
| COMPARATIVE EXAMPLE 3 | 4.8 | 20 | 914.595 | 1885.231 | 970.64 |

TABLE 2

| | ALIGNMENT FILM OM2 ON SLOT SUBSTRATE SIDE | | | | ALIGNMENT FILM OM1 ON TFT SUBSTRATE SIDE | | | |
|---|---|---|---|---|---|---|---|---|
| | MATERIAL | FILM THICKNESS (μm) | RELATIVE DIELECTRIC CONSTANT | PRETILT ANGLE (°) | MATERIAL | FILM THICKNESS (μm) | RELATIVE DIELECTRIC CONSTANT | PRETILT ANGLE (°) |
| EXAMPLE 8 | ACRYLIC | 0.24 | 3.2 | 1 | ACRYLIC | 0.24 | 3.2 | 1 |
| EXAMPLE 9 | POLYIMIDE | 0.24 | 3.8 | 1 | POLYIMIDE | 0.24 | 3.8 | 1 |
| EXAMPLE 10 | POLYIMIDE | 0.24 | 4.2 | 1 | POLYIMIDE | 0.24 | 4.2 | 1 |
| EXAMPLE 11 | POLYIMIDE | 0.18 | 4.2 | 1 | POLYIMIDE | 0.18 | 4.2 | 1 |
| EXAMPLE 12 | POLYIMIDE | 0.12 | 4.2 | 1 | POLYIMIDE | 0.18 | 4.2 | 1 |
| EXAMPLE 13 | POLYIMIDE | 0.12 | 4.2 | 1 | POLYIMIDE | 0 | — | — |
| EXAMPLE 14 | POLYIMIDE | 0.18 | 4.2 | 1 | POLYIMIDE | 0.18 | 4.2 | 1 |
| EXAMPLE 15 | POLYIMIDE | 0.18 | 4.2 | 1 | POLYIMIDE | 0.18 | 4.2 | 1 |

| | CELL THICKNESS L1 (μm) | ELECTRODE OVERLAP L2 (μm) | CAPACITANCE (pF) | | |
|---|---|---|---|---|---|
| | | | C (0 V) | C (15 V) | Δ C |
| EXAMPLE 8 | 4.8 | 20 | 874.61 | 1950.795 | 1076.2 |
| EXAMPLE 9 | 4.8 | 20 | 939.231 | 2135.763 | 1196.5 |
| EXAMPLE 10 | 4.8 | 20 | 979.24 | 2247.621 | 1268.4 |
| EXAMPLE 11 | 4.8 | 20 | 986.583 | 2333.091 | 1346.5 |
| EXAMPLE 12 | 4.8 | 20 | 1010.25 | 2396.83 | 1386.6 |
| EXAMPLE 13 | 4.8 | 20 | 817.565 | 2195.66 | 1378.1 |
| EXAMPLE 14 | 3.9 | 20 | 1069.68 | 2600.354 | 1530.7 |
| EXAMPLE 15 | 3.9 | 30 | 1308.97 | 3219.045 | 1910.1 |

A relative dielectric constant of the alignment film of Examples 1 to 7 was 3.8 or more, and in Examples 2 to 7 in particular, the relative dielectric constant of the alignment film was 4.2 or more. Both of these alignment films are made of a polyimide-based resin. In the liquid crystal cell C of Examples 1 to 7, a variation ΔC in capacitance was 1000 pF or more.

On the other hand, the relative dielectric constants of each of the alignment films of Comparative Examples 1 to 3 were 2.6, 2.9, and 3.2, and were a value lower than those of Examples 1 to 7. Each of the alignment films of Comparative Examples 1 to 3 is made of an acrylic resin. In the liquid crystal cells of Comparative Examples 1 to 3, the variation ΔC in capacitance was all less than 1000 pF.

Example 3 is the same condition as in Example 2 except that the thickness of the alignment film is reduced. It was confirmed that when the thickness of the alignment film was reduced as in Example 3, a variation ΔC in capacitance was increased.

In Example 4, a thickness of an alignment film on a TFT substrate is set to be further increased than a thickness of an alignment film on a slot substrate. Even though the alignment films on the TFT substrate and the slot substrate have a different thickness from each other as described above, by setting each alignment film to have a thickness of 180 nm or less, it is possible to further increase a variation ΔC in capacitance compared with Example 2 or the like.

In Example 5, an alignment film may be formed only on a slot substrate. Even when the alignment film is formed only on one of the substrates as described above, if the produced alignment film has a thickness of 120 nm or less, it is possible to further increase a variation ΔC in capacitance compared with Example 2 or the like.

In Example 6, a thickness of the cell L1 may be set smaller than that of Example 1. By setting a thickness of the cell L1 to be small as described above, it is possible to increase a variation ΔC in capacitance compared with Example 1 or the like.

When the thickness of the cell L1 of the liquid crystal cell C is a distance between a surface of an alignment film formed on a patch electrode of a TFT substrate and a surface of an alignment film formed on a slot electrode of a slot substrate when the alignment film is formed on both the TFT substrate and the slot substrate. In addition, when the alignment film is formed on any one of the TFT substrate and the slot substrate, the thickness of the cell L1 of the liquid crystal cell C is set a distance between the surface of the alignment film and the electrode surface of the substrate on which the alignment film.

In Example 7, a length (electrode overlap L2) at which a patch electrode of a TFT substrate and a slot electrode of a slot substrate overlap each other is set to be further increased compared with Example 1 and the like. It is possible to further increase a variation ΔC in capacitance by further increasing an electrode overlap L2 in this way.

In Examples 8 to 15, a pretilt angle was set to 1°. By setting a pretilt angle to 1° in this manner, a variation ΔC in capacitance can be further increased compared with Comparative Example 1 and the like.

In Example 8, an alignment film (relative dielectric constant of 3.2) made of an acrylic resin was used, and the pretilt angle was set to 1°. Even when the alignment film having a low relative dielectric constant is used as described above, it is possible to increase the variation ΔC in capacitance by increasing the pretilt angle.

In Examples 9 and 10, the alignment film (relative dielectric constant of 3.8 and relative dielectric constant of 4.2) made of a polyimide-based resin was used, and the pretilt angle was set to 1°. In addition to decreasing the pretilt angle as described above, it is possible to increase the variation ΔC in capacitance by using the alignment film having a large relative dielectric constant compared with Example 8 or the like.

In Example 11, in addition to decreasing the pretilt angle, the alignment film (relative dielectric constant of 4.2, film thickness of 0.18 μm) made of the polyimide-based resin having a high relative dielectric constant and a smaller film thickness than that of Example 10 or the like may be used. In Example 11, it is possible to further increase the variation ΔC in capacitance.

In Example 12, in addition to decreasing the pretilt angle, the relative constant may be set higher, and the thickness of the alignment film on the TFT substrate may also be set to be further increased than the thickness of the alignment film on the slot substrate. In Example 12 as described above, by setting each alignment film to have a thickness of 180 nm or less, it is possible to further increase the variation ΔC in capacitance.

In Example 13, the alignment film having a small pretilt angle may be formed only on the slot substrate. In Example 13 as described above, if the produced alignment film has a thickness of 120 nm or less, it is possible to further increase the variation ΔC in capacitance.

In Example 14, the thickness of the cell L1 may be set smaller than that of Example 11. By setting the thickness of the cell L1 to be small as described above, it is possible to increase the variation ΔC in capacitance compared with Example 11 or the like.

In Example 15, a length (electrode overlap L2) at which a patch electrode of a TFT substrate and a slot electrode of a slot substrate overlap each other is set to be further increased compared with Example 11 and the like. It is possible to further increase a variation ΔC in capacitance by further increasing an electrode overlap L2 in this way.

Hereinafter, the production examples of the alignment film used for the simulation will be described.

The polyimide-based alignment films (relative dielectric constants of 3.8 and 4.2) used in Examples 1 to 7 and 9 to 15 can be produced by forming a coating film from an alignment agent obtained, for example, by dissolving the polyamic acid represented by the chemical formula (1) in an organic solvent, appropriately heating the coating film for the purpose of solvent removal, imidization and the like, and performing rubbing treatment or photo alignment treatment on the coating film such that the pretilt angle becomes 5° or 1°.

The acrylic alignment films (relative dielectric constant of 3.2) used in Comparative Example 3 and Example 8 can be produced by forming a coating film from an alignment agent obtained, for example, by dissolving polymethyl methacrylate (PMMA) in an organic solvent, appropriately heating the coating film for the purpose of solvent removal and the like, and performing rubbing treatment or photo alignment treatment on the coating film such that the pretilt angle becomes 5° or 1°.

EXPLANATION OF SYMBOLS

10: Dielectric substrate (First dielectric substrate)
3: Gate electrode
4: Gate insulating layer
5: Semiconductor layer
6D: Drain contact layer
6S: Source contact layer

27

7D: Drain electrode
7S: Source electrode
10: TFT
11: First insulating layer
15: Patch electrode
17: Second insulating layer
51: Dielectric substrate (Second dielectric substrate)
55: Slot electrode
55L: Lower layer
55M: Main layer
55U: Upper layer
57: Slot
57U: Slot electrode unit
58: Third insulating layer
70: Feeding device
72: Feeding pin
101: TFT substrate
201: Slot substrate
1000: Scanning antenna
U: Antenna unit (Antenna unit region)
CH1: Contact hole
LC: Liquid crystal layer
Ic1: Liquid crystal compound
C: Liquid crystal cell
GD: Gate driver
GL: Gate bus line
GT: Gate terminal portion
SD: Source driver
SL: Source bus line
ST: Source terminal portion
PT: Transfer terminal portion
R1: Transmission/reception region
R2: Non-transmission/reception region
Rs: Seal region
S: Sealing material
OM, OM1, OM2: Alignment film
C: Liquid crystal cell
L1: Thickness of cell
L2: Electrode Overlap amount

The invention claimed is:

1. A liquid crystal cell comprising:
a thin film transistor (TFT) substrate including a first dielectric substrate, a plurality of TFTs supported on the first dielectric substrate, and a plurality of patch electrodes electrically connected to the TFTs;
a slot substrate including a second dielectric substrate and a slot electrode including a plurality of slots supported on the second dielectric substrate;
a liquid crystal layer interposed between the TFT substrate and the slot substrate that are arranged such that the plurality of patch electrodes and the slot electrode face each other;
a plurality of antenna units each including one of the patch electrodes and the slot electrode including at least one of the slots arranged corresponding to the one of the patch electrodes; and
alignment films formed on surfaces of both of the TFT substrate and the slot substrate facing the liquid crystal layer, the alignment films being made of a polyimide-based resin, and having a relative dielectric constant of 3.8 or more.

2. The liquid crystal cell according to claim 1, wherein the alignment film has the relative dielectric constant of 4.2 or more.

3. The liquid crystal cell according to claim 1, wherein the alignment film has a thickness of 0.18 μm or less.

28

4. The liquid crystal cell according to claim 1, wherein the alignment film formed on the TFT substrate and the alignment film formed on the slot substrate have a different thickness from each other, and both the alignment films have a thickness of 0.18 μm or less.

5. The liquid crystal cell according to claim 1, wherein the liquid crystal cell has a thickness of 3.9 μm or less.

6. The liquid crystal cell according to claim 1, wherein in one of the antenna units, the patch electrode and the slot electrode overlap each other at a length of 30 μm or more.

7. The liquid crystal cell according to claim 1, wherein the slot has a width of 60 μm or more.

8. The liquid crystal cell according to claim 1, wherein the alignment film aligns a liquid crystal compound included in the liquid crystal layer at a pretilt angle of 1° or less.

9. The liquid crystal cell according to claim 8, wherein the liquid crystal compound has a positive dielectric anisotropy.

10. The liquid crystal cell according to claim 9, wherein the liquid crystal compound has a dielectric anisotropy $\Delta\varepsilon$ of 10 or more.

11. The liquid crystal cell according to claim 1, wherein a variation $\Delta C$ in capacitance when no voltage is applied and when a voltage of 15 V is applied between the patch electrode of the TFT substrate and the slot electrode of the slot substrate is 1000 pF or more.

12. A scanning antenna, comprising:
the liquid crystal cell according to claim 1; and
a reflective conductive plate disposed so as to face an opposite surface of the second dielectric substrate on which the slot electrode is not formed, with a dielectric layer interposed therebetween.

13. A liquid crystal cell comprising:
a TFT substrate including a first dielectric substrate, a plurality of TFTs supported on the first dielectric substrate, and a plurality of patch electrodes electrically connected to the TFTs;
a slot substrate having a second dielectric substrate and a slot electrode including a plurality of slots supported on the second dielectric substrate;
a liquid crystal layer interposed between the TFT substrate and the slot substrate that are arranged such that the plurality of patch electrodes and the slot electrode face each other;
a plurality of antenna units each including one of the patch electrodes and the slot electrode including at least one of the slots arranged corresponding to the one of the patch electrode; and
an alignment film formed on a surface of any one of the TFT substrate and the slot substrate facing the liquid crystal layer, the alignment film being made of a polyimide-based resin, and having a relative dielectric constant of 3.8 or more.

14. The liquid crystal cell according to claim 13, wherein the alignment film has a thickness of 0.12 μm or less.

15. A liquid crystal cell comprising:
a thin film transistor (TFT) substrate including a first dielectric substrate, a plurality of TFTs supported on the first dielectric substrate, and a plurality of patch electrodes electrically connected to the TFTs;
a slot substrate including a second dielectric substrate and a slot electrode including a plurality of slots supported on the second dielectric substrate;
a liquid crystal layer interposed between the TFT substrate and the slot substrate that are arranged such that the plurality of patch electrodes and the slot electrode face each other;

a plurality of antenna units each including one of the patch electrodes and the slot electrode including at least one of the slots arranged corresponding to the one of the patch electrodes; and alignment films formed on surfaces of both of the TFT substrate and the slot substrate facing the liquid crystal layer, the alignment films being made of a polyimide-based resin, and having a relative dielectric constant of 3.8 or more;

wherein the alignment films are made of one or more of the following Chemical Formulas (1) and (2):

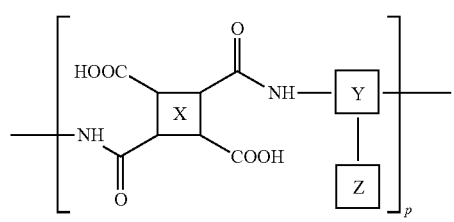
(1)

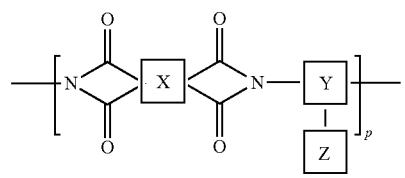
(2)

where in the Chemical Formulas (1) and (2), p is an arbitrary natural number and X has a structure represented by at least one of the following Chemical Formulas (3-1) to (3-4) and (3-6) to (3-16):

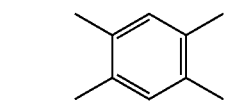
(3-1)

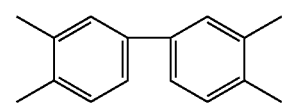
(3-2)

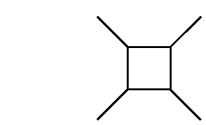
(3-3)

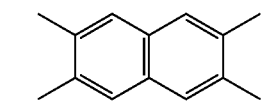
(3-4)

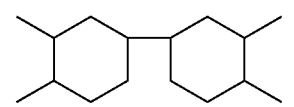
(3-6)

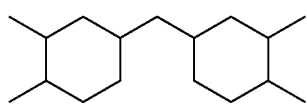
(3-7)

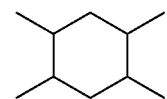
(3-8)

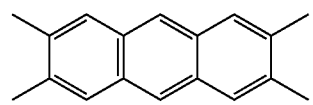
(3-9)

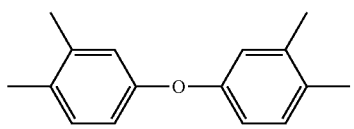
(3-10)

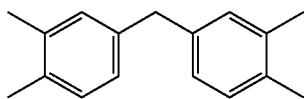
(3-11)

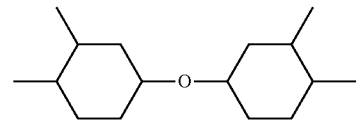
(3-12)

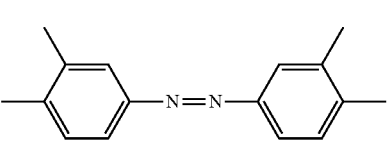
(3-13)

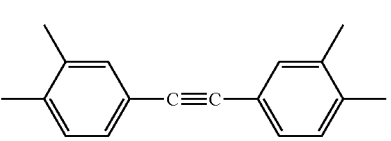
(3-14)

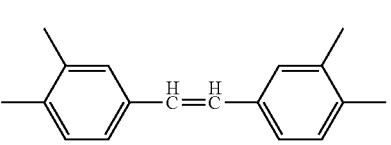
(3-15)

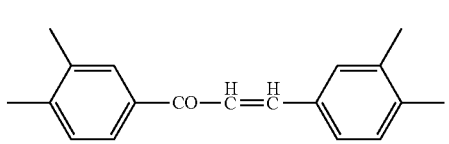
(3-16)

and, in the Chemical Formulas (1) and (2), Y has a structure represented by the following Chemical Formulas (4-1) to (4-9) and (4-12) to (4-24):

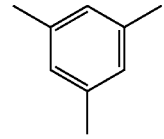
(4-1)

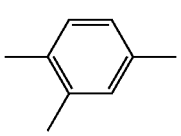
(4-2)

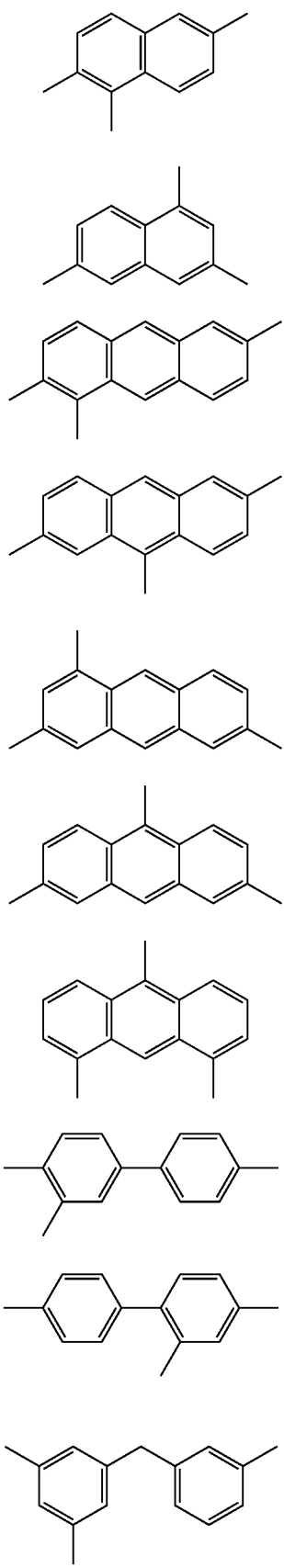
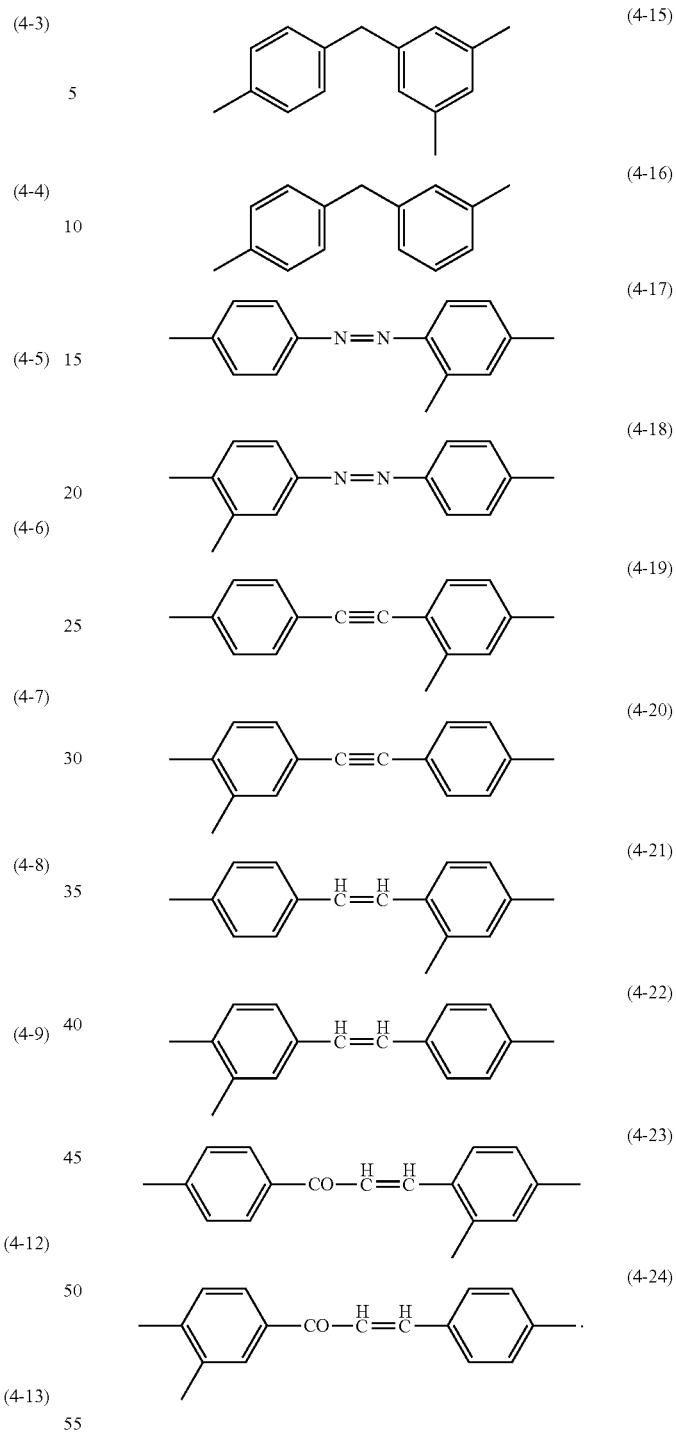

16. The liquid crystal cell according to claim 15, wherein the alignment film has the relative dielectric constant of 4.2 or more.

17. The liquid crystal cell according to claim 15, wherein the alignment film has a thickness of 0.18 μm or less.

18. The liquid crystal cell according to claim 15, wherein the alignment film formed on the TFT substrate and the alignment film formed on the slot substrate have a different thickness from each other, and both the alignment films have a thickness of 0.18 μm or less.

19. The liquid crystal cell according to claim 15, wherein the alignment film has a thickness of 0.12 μm or less.

20. The liquid crystal cell according to claim 15, wherein the liquid crystal cell has a thickness of 3.9 µm or less.

21. The liquid crystal cell according to claim 15, wherein in one of the antenna units, the patch electrode and the slot electrode overlap each other at a length of 30 µm or more.

22. The liquid crystal cell according to claim 15, wherein the slot has a width of 60 µm or more.

23. The liquid crystal cell according to claim 15, wherein the alignment film aligns a liquid crystal compound included in the liquid crystal layer at a pretilt angle of 1° or less.

24. The liquid crystal cell according to claim 23, wherein the liquid crystal compound has a positive dielectric anisotropy.

25. The liquid crystal cell according to claim 15, wherein the liquid crystal compound has a dielectric anisotropy $\Delta\varepsilon$ of 10 or more.

26. The liquid crystal cell according to claim 15, wherein a variation $\Delta C$ in capacitance when no voltage is applied and when a voltage of 15 V is applied between the patch electrode of the TFT substrate and the slot electrode of the slot substrate is 1000 pF or more.

27. A scanning antenna, comprising:
   the liquid crystal cell according to claim 15; and
   a reflective conductive plate disposed so as to face an opposite surface of the second dielectric substrate on which the slot electrode is not formed, with a dielectric layer interposed therebetween.

\* \* \* \* \*